(12) United States Patent
Denison et al.

(10) Patent No.: US 6,611,168 B1
(45) Date of Patent: Aug. 26, 2003

(54) DIFFERENTIAL PARAMETRIC AMPLIFIER WITH PHYSICALLY-COUPLED ELECTRICALLY-ISOLATED MICROMACHINED STRUCTURES

(75) Inventors: Timothy J. Denison, Andover, MA (US); Thomas W. Kelly, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/024,741

(22) Filed: Dec. 19, 2001

(51) Int. Cl.[7] .................................................. H03F 7/00
(52) U.S. Cl. ......................................... 330/4.5; 330/4.9
(58) Field of Search ............................... 330/4.5, 4.9, 9

(56) References Cited

U.S. PATENT DOCUMENTS

| | | | |
|---|---|---|---|
| 3,433,976 A | | 3/1969 | Marechal ..................... 330/4.9 |
| 3,699,454 A | * | 10/1972 | Hudspeth et al. ......... 330/4.5 X |
| 4,426,737 A | * | 1/1984 | Mori ........................ 330/4.9 X |
| 4,674,319 A | | 6/1987 | Muller et al. .................. 73/23 |
| 4,814,695 A | | 3/1989 | Troesch ....................... 324/118 |
| 5,136,247 A | | 8/1992 | Hansen ....................... 324/457 |
| 5,341,114 A | * | 8/1994 | Calviello et al. ......... 330/4.9 X |
| 5,473,945 A | | 12/1995 | Grieff et al. .................. 73/510 |
| 5,491,604 A | | 2/1996 | Nguyen et al. ............. 361/278 |

(List continued on next page.)

OTHER PUBLICATIONS

"An SOI Based, Fully Integrated Fabrication Process for High–Aspect–Radio Microelectromechanical Systems," Timothy J. Brosnihan. *University of California, Berkley*. Fall 1998. p. 1–138.

"A 50–fA Junction–Isolated Operational Amplifier", Close et al., IEEE Journal of Solid–State Circuits, vol. 23, No. 3, Jun. 1988, pp.:843–851.

Prolog to "Fundamentals of Low–Noise Analog Circuit Design", George Likouezos, Proceedings of the IEEE, vol. 82, No. 10, Oct. 1994, pp.: 1514–1538.

"With input bias current of 40 fA, op amp IC makes low–level measurements", Roy Kaller, Electronic Design, vol. 34, No. 11, May 1986, pp.: 141–144.

"Circuit Techniques for Reducing the Effects of Op–Amp Imperfections: Autozeroing, Correlated Double Sampling, and Chopper Stabilization", Enz et al., Proceedings of the IEEE, vol. 84, No. 11, Nov. 1996, pp.: 1584–1614.

"Design of Dynamic Condenser Electrometers", Palevsky et al., The Review of Scientific Instruments, vol. 18, No. 5, May 1947, pp.: 298–314.

"Op Amps as Electrometers or—The World of fA", Analog Dialogue 5–2, 1971, pp.: 48–49.

"A Novel Parametric–Effect MEMS Amplifier," Raskin et al. *Journal of Microelectromechanical Systems*. Dec. 2000. vol. 9, No. 4.

*Primary Examiner*—Steven J. Mottola
(74) *Attorney, Agent, or Firm*—Samuels, Gauthier & Stevens, LLP

(57) ABSTRACT

A micromachined variable capacitor structure is used as a modulation mechanism for a differential parametric amplifier. The capacitance of the capacitor structure is modulated by a control signal while a differential signal is applied to the capacitor structure. Modulation of the capacitance produces a signal representative of the input differential voltage. This signal is provided to an amplifier. Once the signal is amplified, a demodulator demodulates the amplified signal to provide an amplified version of the differential signal. The variable capacitor structure also allows for internal feedback, which permits the parametric amplifier to be used as a galvanically isolated differential measurement amplifier. A number of techniques are used to remove common mode and other errors from the modulated difference signal, thereby eliminating them from the amplified output.

35 Claims, 19 Drawing Sheets

U.S. PATENT DOCUMENTS

| | | | |
|---|---|---|---|
| 5,506,175 A | 4/1996 | Zhang et al. | 437/228 |
| 5,635,739 A | 6/1997 | Grieff et al. | 257/254 |
| 5,640,133 A | 6/1997 | MacDonald et al. | 333/197 |
| 5,796,001 A | 8/1998 | Greiff et al. | 73/504.16 |
| 5,846,849 A | 12/1998 | Shaw et al. | 438/52 |
| 5,847,454 A | 12/1998 | Shaw et al. | 257/734 |
| 5,911,156 A | 6/1999 | Ward et al. | 73/504.16 |
| 5,914,553 A | 6/1999 | Adams et al. | 310/309 |
| 5,920,190 A | 7/1999 | Peterson et al. | 324/126 |
| 5,952,572 A | 9/1999 | Yamashita et al. | 73/504.4 |
| 5,952,574 A | 9/1999 | Weinberg et al. | 73/504.16 |
| 5,955,932 A | 9/1999 | Nguyen et al. | 333/186 |
| 5,959,516 A | 9/1999 | Chang et al. | 334/14 |
| 5,992,233 A | 11/1999 | Clark | 73/514.35 |
| 6,000,280 A | 12/1999 | Miller et al. | 73/105 |
| 6,054,335 A | 4/2000 | Sun et al. | 438/23 |
| 6,060,336 A | 5/2000 | Wan | 438/50 |
| 6,073,484 A | 6/2000 | Miller et al. | 73/105 |
| 6,074,890 A | 6/2000 | Yao et al. | 438/52 |
| 6,121,552 A | 9/2000 | Brosnihan et al. | 174/253 |
| 6,149,190 A | 11/2000 | Galvin et al. | 280/735 |
| 6,268,635 B1 | 7/2001 | Wood | 257/415 |
| 6,291,875 B1 | 9/2001 | Clark et al. | 257/622 |

\* cited by examiner

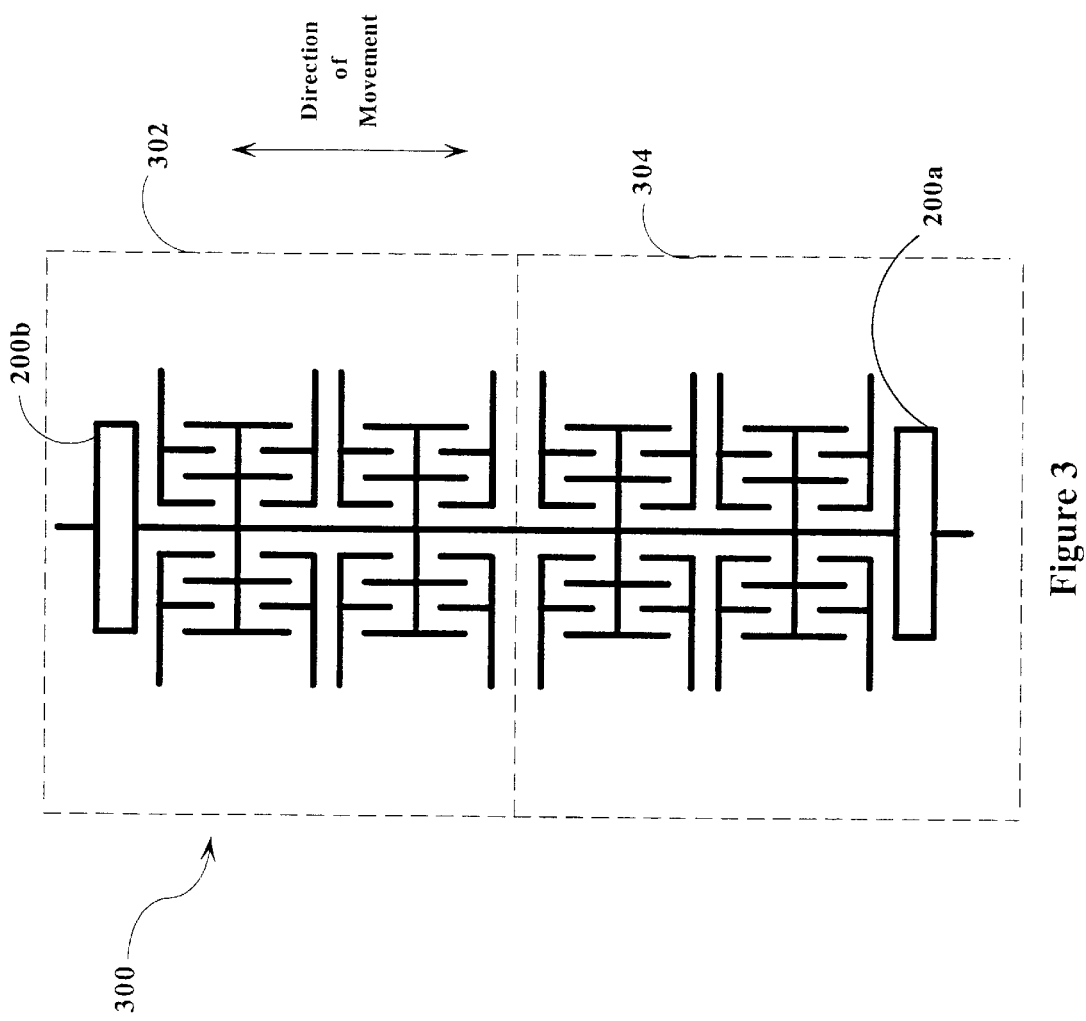

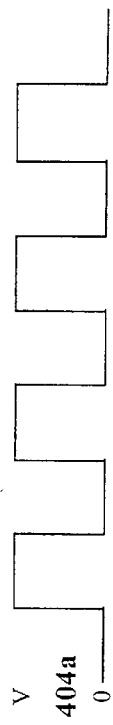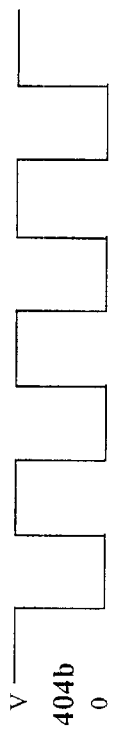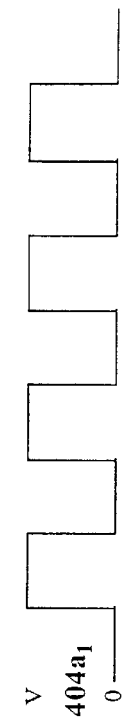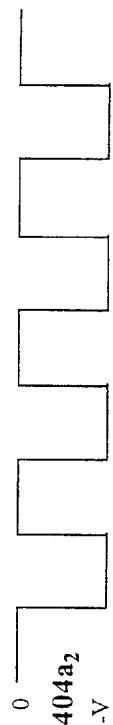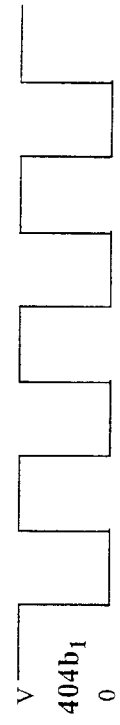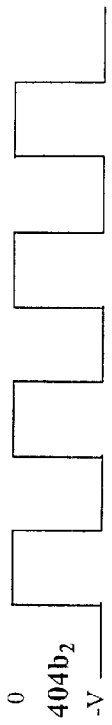
Figure 4c
Figure 4d
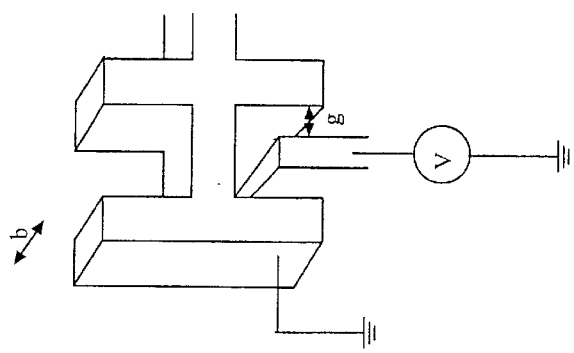
Figure 4b

DIFFERENTIAL PARAMETRIC AMPLIFIER WITH PHYSICALLY-COUPLED ELECTRICALLY-ISOLATED MICROMACHINED STRUCTURES

BACKGROUND OF THE INVENTION

The invention relates to the field of parametric amplifiers, and in particular to micro-fabricated parametric amplifiers.

An ideal differential voltage amplifier is often characterized by low-input bias currents, high input impedance, low input-referred voltage offset and drift, low input-referred voltage and current noise, wide bandwidth response, wide input common-mode swing, high common-mode rejection, and either high differential gain for operational amplifiers or stable differential gain for instrumentation amplifiers. For many potential applications, e.g. pH meters, thermocouples, electrometers, or ion gauges, wide bandwidth is not particularly important, while the demands on the amplifier with regard to noise, input impedance, leakage currents, offset/drift and common mode range are quite high. For applications of this sort, the amplifier's mechanism of input signal transduction is of utmost importance since it will define the performance of the amplifier with regard to these metrics.

Current solid-state microfabrication technology limits the performance of amplifier topologies. The potential solid-state transducers that are in common use today include the bipolar junction transistor (BJT), the metal-oxide-semiconductor field effect transistor (MOSFET), and the junction field-effect transistor (JFET). The BJT exhibits excellent offset and noise performance, but at the expense of large input bias currents and low input impedance. The MOSFET transistor provides excellent low-leakage bias currents and generally high impedances, but compromises amplifier performance due to large offsets, drift, and noise. The JFET often strikes a reasonable balance between low leakage currents, noise, and offsets, but leakage performance severely degrades at elevated temperatures where many instrumentation applications operate. As a final consideration, circuit topologies that utilize these solid state devices suffer from severe limits in their common-mode swing. The principles of differential voltage amplifiers are further discussed in "A 50-fA Junction-Isolated Operational Amplifier," IEEE Journal of Solid-State Circuits, vol. 23, no 3, pp843–851, June 1988; "Fundamentals of Low-Noise Analog Circuit Design," Proceedings of the IEEE, vol. 82, no. 10, pp1514–1538, October 1994 and "With Input Bias Current of 40 fA, OP AMP IC Makes Low-Level Measurements," Electronic Design Exclusive.

The offset and drift performance of low-leakage amplifiers (e.g., MOSFET) can be enhanced with signal processing techniques. For example, the input signal can be modulated to an AC frequency beyond the 1/f noise corner of the input transducer and thereby amplified within a spectral region of relatively low noise. The amplified AC signal is then demodulated and filtered, yielding relatively low offset and drift amplification with MOSFET input transistors; this technique is commonly referred to as chopper-stabilization. A more detailed description of chopper stabilization techniques is provided in "Circuit Techniques for Reducing the Effects of Op-Amp Imperfections: Autozeroing, Correlated Double Sampling, and Chopper Stabilization," Proceedings of the IEE, vol. 84, no. 11, pp1584–1614, November 1996.

Many signals of interest, however, are inherently DC or low frequency and provide no mechanism to modulate their spectral characteristics to a higher AC frequency. In these applications, additional circuitry or methods are needed to provide the required modulation. Many techniques exist which either chop the signal input's polarity with respect to the amplifier's input stage or apply an alternative switching scheme to auto-zero the amplifier prior to signal amplification. The problem with both of these techniques is the requirement for switching at the input of the amplifier. In order to achieve switching in a monolithic amplifier, solid state switches must be employed that result in both charge injection and parasitic leakage currents that are often greater than the input transistor leakage. The use of mechanical switches, e.g., reed relays, results in severe bandwidth limitations, finite amplifier lifetime due to switch wear, and physically awkward devices.

These problems with practical modulation of the input signal can be addressed with a class of circuits known as parametric amplifiers. Parametric amplifiers operate by using the variation of some physical parameter to transduce a low-frequency input voltage or current into an upmodulated AC signal. One of the most promising of these techniques is the vibrating capacitor amplifier. In a vibrating capacitor amplifier, the voltage of interest is applied to a capacitor that can be dynamically adjusted. The capacitor magnitude is then modulated, yielding an AC voltage at the amplifier with a frequency above the 1/f corner of the amplifier. The input impedance is defined by the modulation capacitance, yielding, in principle, very high input impedance and low bias currents. This technique has historically provided the most accurate measurements of voltage and charge. A more detailed discussion of vibrating capacitor amplifiers is provided in the article "Design of Dynamic Condenser Electrometers," The Review Of Scientific Instruments, vol. 18, no. 5, pp. 298–314, May 1947.

The challenge of constructing a vibrating capacitor amplifier is creating a suitable modulation capacitor. In the past, these capacitors have been constructed with the aid of reed relays, mechanically adjustable plates connected to piezoelectrics, or varactors constructed from reverse-biased semiconductor junctions. All of these techniques result in large mechanical structures that are expensive to manufacture in bulk and have limited bandwidth. In addition, the poor physical matching of these structures has effectively prevented the creation of a high-performance differential vibrating capacitor amplifier that can be used for high performance, galvanically isolated, instrumentation amplifiers and electrometer grade operational amplifiers.

SUMMARY OF THE INVENTION

A parametric amplifier is provided which has a micromachined variable capacitor structure that includes a drive section, an input sense section, a force feedback section and an input feedback section. The drive section, input sense section, force feedback section and input feedback section each comprise cooperating fixed and movable electrodes. The movable electrodes of each section are connected to a common center structure. One or more electromotive forces generated by one or more voltages applied to the fixed electrodes of the drive section and one or more spring motive forces place the common center structure in motion to oscillate the movable electrodes. The fixed electrodes of the force feedback section provide a velocity signal to an oscillation control circuit. The velocity signal is representative the common center structure's velocity with respect to the fixed electrodes. The oscillation control circuit generates the one or more electrostatic forces applied to the fixed electrodes of the drive section based upon the velocity signal. A differential input signal applied across the input sense section's capacitive elements is transduced into a modulated input signal by the oscillation of the movable electrodes. An ac amplifier receives the modulated signal via the common center structure and outputs an amplified modulated input signal. A demodulator receives the amplified, modulated input signal and demodulates it using a reference generated from the velocity signal to output an amplified input signal. When used as an instrumentation amplifier, the output of the demodulator can also be fed back to a secondary set of fixed electrodes of the input feedback section for improved linearity and galvanic isolation. The excellent physical matching of the mechanical structure allows for the creation of differential parametric amplifier topologies, and the small geometry of the micromachined element increases the bandwidth achievable with the device.

BRIEF DESCRIPTION OF THE DRAWINGS

FIG. 3 illustrates the preferred variable capacitor chopper mechanism.

FIG. 4b illustrates the dimensions of the preferred chopper mechanism for determining the motive force induced by an applied electrostatic force.

FIG. 4c illustrates a voltage waveform for driving the preferred chopper mechanism.

FIG. 4d illustrates a voltage waveform for driving the preferred chopper mechanism that reduces contamination of the desired signal with the force excitation signal.

DETAILED DESCRIPTION OF THE INVENTION

Figure 1:
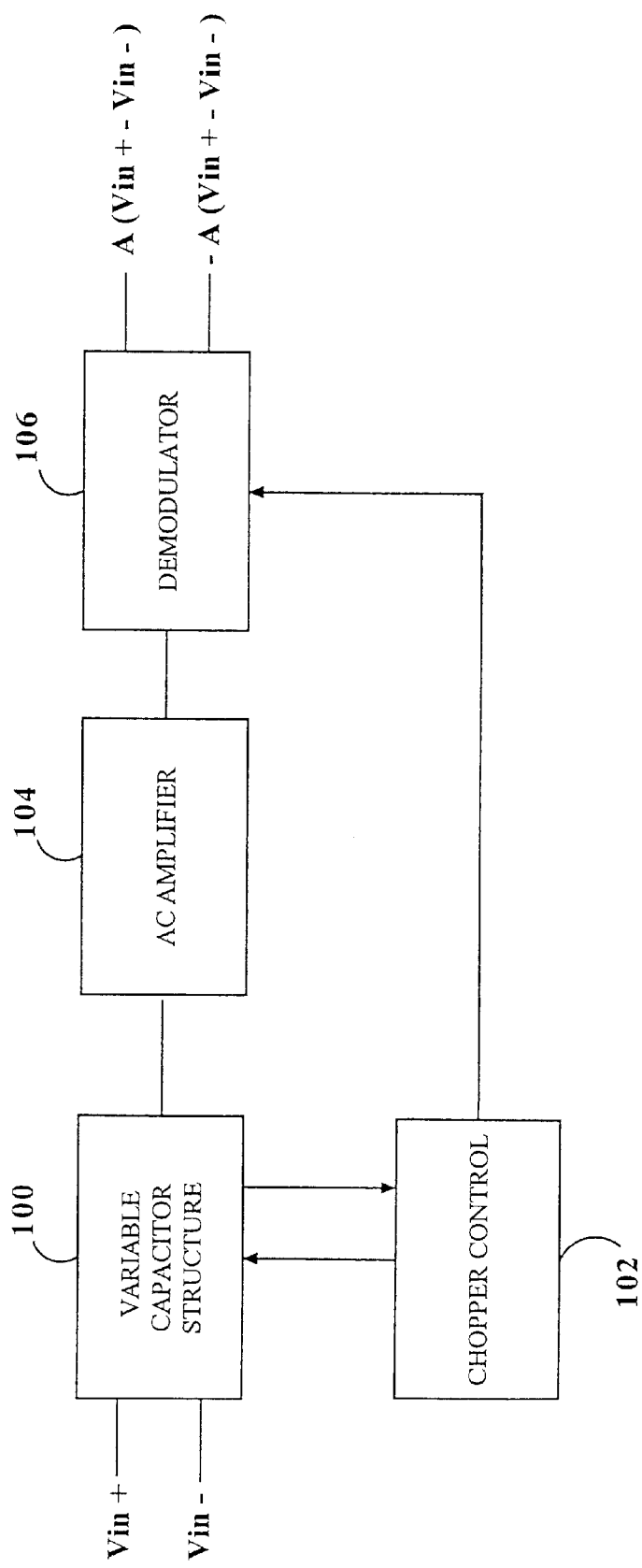
FIG. 1 generally illustrates a parametric amplifier using a micromachined variable capacitor according to the principles of the present invention.

FIG. 1 generally illustrates a parametric amplifier using a micromachined variable capacitor. A variable capacitor structure 100 is utilized as a mechanical chopper mechanism and is connected to an ac amplifier 104, which is in turn connected to a demodulator 106. Variable capacitor structure 100 is micromachined from conductive material, preferably highly-doped silicon, using standard micromachining techniques. A control signal is provided by chopper control circuitry 102 to periodically vary the capacitance of the capacitive elements of structure 100. Chopper control 102 reads parameters from variable capacitor structure to produce the control signal. While the capacitance is varied, a first input voltage $V_{in+}$ is applied across a first set of varying capacitive elements of capacitor structure 100.

When the first input voltage is applied across the first set of varying capacitive elements, a current is produced according to the capacitor current equation, $$I_1(t) = C_1\left(\frac{dV_{in+}}{dt}\right) + V_{in+}\left(\frac{dC_1}{dt}\right),$$

where $V_{in+}$ represents the voltage applied to the first set of capacitive elements, and $C_1$ represents the capacitance of those elements. Therefore, when the capacitance of the first set is periodically varied, a transduced current is produced that is modulated according to the $$V_{in+}\left(\frac{dC_1}{dt}\right)$$

term.

Likewise, a second input voltage $V_{in-}$ is applied across a second set of varying capacitive elements of capacitor structure 100. This also produces a current according to the capacitor current equation, $$I_2(t) = C_2\left(\frac{dV_{in-}}{dt}\right) + V_{in-}\left(\frac{dC_2}{dt}\right),$$

where $V_{in-}$ represents the voltage applied to the second set of capacitive elements, and $C_2$ represents the capacitance of those elements. Therefore, when the capacitance of the second set is periodically varied, a transduced current is produced that is modulated according to the $$V_{in-}\left(\frac{dC_2}{dt}\right)$$

Variable capacitor structure 100 is designed so that these currents, $I_1$ and $I_2$, are superimposed in such a manner to produce a total transduced, modulated current, which is representative of the difference between the input voltages $V_{in+}$ and $V_{in-}$, i.e. it is representative of the differential input voltage.

The total current is then provided to an ac amplifier 104, which amplifies this signal. Note that amplifier 104 is designed to keep its input node at virtual ground. The amplified signal is then provided to a demodulator 106, which removes the modulation imposed upon the differential input signal. A phasing signal is preferably provided to demodulator 106 to keep it in phase with the modulated signal. Once the amplified signal has been demodulated, it is lowpass filtered and output as an amplified voltage $A(V_{in+}-V_{in-})$ for a single-ended output. When a differential output is required, $-A(V_{in+}-V_{in-})$ is also output.

As will be readily apparent to one of skill in the art, the amplifier 104 can also be used to amplify a differential, modulated voltage or charge, even though described herein as amplifying a differential, modulated current. Thus, as will be apparent, the variable capacitor structure 100 can be used to produce current, voltage, or charge that is detected by ac amplifier 104. Further, as would be appreciated by one of skill in the art, amplifying includes gains greater than one, less than one or equal to one. That is, A can have values greater than, equal to, or less than one.

Using a variable capacitor structure that can be fabricated using micromachining techniques provides for a mechanical chopper that has reduced bulk and costs from prior art implementations of chopper mechanisms. Further, micromachining allows for small, but also well-matched capacitive structures that can operate at frequencies much higher than conventional methods (>10 kHz compared with 100 Hz). In sum, a micromachined mechanical chopper allows for a differential amplifier with extremely low-leakage currents, low noise, low offset and drift, and ultra-wide common mode swing. In prior differential variable capacitor amplifiers these characteristics are poor because of the difficulty in producing well-matched bulk capacitive devices for the mechanical choppers. As a result, most prior variable capacitor amplifiers were single-ended, i.e. only measured input voltages with respect to ground. In addition, the preferred chopper mechanism's differential structure suppresses the offset drift contributed by the capacitor plate's material work function (surface charges), which, in the past, set the lower threshold for sensitivity in vibrating capacitor amplifiers.

Generally, it is preferable to filter the differential input voltage prior to amplification. Typically, the differential input signal will have frequency content that above the desired range to be amplified. Because of difficulties in making an anti-aliasing filter for a floating differential amplifier that effectively rejects common mode signals, in some applications it is desirable to use a differential antialiasing filter and, as will be described below, use an embodiment of the amplifier that has increased common mode rejection.

VARIABLE CAPACITOR CHOPPER MECHANISM

Figure 2:
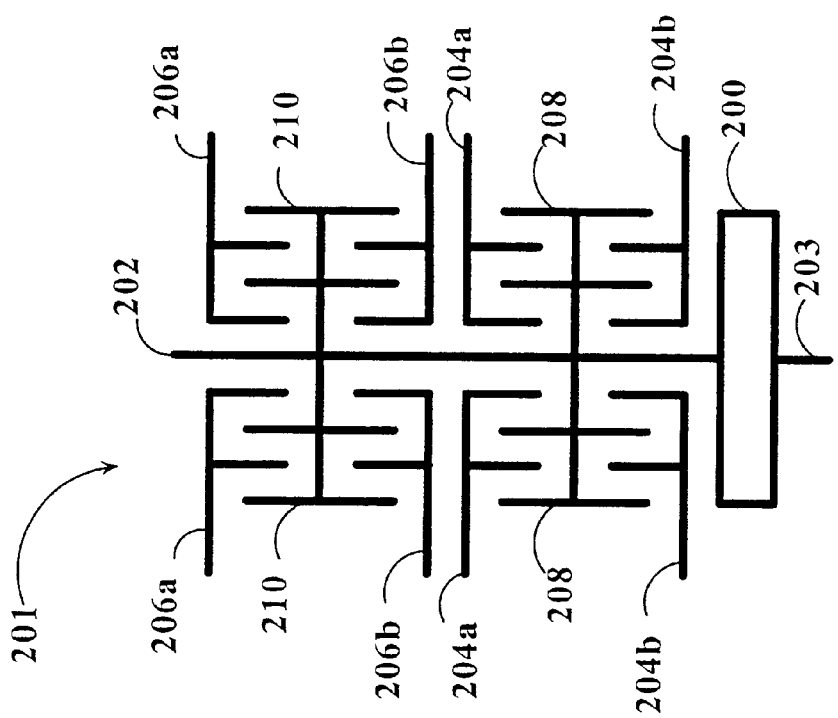
FIG. 2 illustrates the basic building block structure of the preferred embodiment of a variable capacitor chopper mechanism.

FIG. 2 illustrates the basic building block structure 201 of a variable capacitor chopper mechanism according to the present invention. A common center structure 202 has connected to it finger structures 208, 210, which comprise a cross conducting beam with one or more perpendicular fingers. In the simplest embodiment, common center structure 202 is a single central conducting beam. Central beam 202 and connected finger structures 208, 210 are connected to a spring structure 200 for movement of conducting beam 202 and finger structures 208, 210 parallel to the length of conducting beam 202. Each set of moving finger structures 208, 210 has corresponding fixed finger structures 206a, 206b, 204a, 204b interlaced therewith.

Interlacing moving finger structures 208, 210 and corresponding fixed finger structures 206a, 206b, 204a, 204b create overlap capacitances which vary in a linear fashion as central beam 202 and connected finger structures 208, 210 are moved in a direction parallel to the length of central beam 202. In addition, as central beam 202 and connected finger structures 208, 210 are moved, the capacitance on one side of a finger structure 208, 210 increases, while that of the other side decreases. For instance, when central beam 202 and the attached structures 208, 210 move parallel to the length of central beam 202 away from spring structure 200, the capacitance between fixed finger structure 206a and moving finger structure 210 increases, while the capacitance between fixed finger structure 206a and moving finger structure 210 decreases.

When microfabricated as a microelectromechanical system (MEMS) in silicon, structure 201 (and, thus, the chopper mechanism) is preferably fabricated using silicon-on-insulator (SOI) MEMS techniques, such as those described in Brosnihan, Timothy John. 1998. "An SOI Based, Fully Integrated Fabrication Process for High-Aspect-Ratio Microelectromechanical Systems." Ph.D. Thesis, University of California, Berkeley. Generally, a nitride/poly/nitride isolation trench separates an area of an SOI wafer for the chopper mechanism from circuit areas. The chopper mechanism is etched in the top silicon layer of the wafer in the region defined by the isolation trench. The movable parts of the chopper mechanism are released for movement by etching the underlying oxide layer.

Moving portions of structure 201 are mechanically tied to the substrate via spring structure 200 and an anchor 203. Anchor 203 is connected to and electrically isolated from the substrate with the isolation trench. This type of arrangement is further described in Brosnihan, Timoyhy John. 1998. "An SOI Based, Fully Integrated Fabrication Process for High-Aspect-Ratio Microelectromechanical Systems." Ph.D. Thesis, University of California, Berkeley. Electrical connection with central beam 202 is preferably made at fixed anchor 203 through a metal contact. Fixed finger structures 206a, 206b, 204a and 204b are also connected to and electrically isolated from the substrate using the same isolation trench. Several isolation trenches connected electrically in series may be used to increase the allowable common mode range of an amplifier built according to the present invention. The end opposite of spring structure 200 and anchor 203 is formed with other building blocks to create a complete chopper mechanism structure.

A variable capacitor chopper mechanism 300 according to the present invention is shown in FIG. 3. As shown, chopper mechanism 300 has a lower portion 304, which is one basic building block structure 201. Attached to bottom portion 304 is a second building block structure 201 forming a top portion 302 of chopper mechanism structure 300. When implemented in a parametric amplifier, lower portion 304, together with spring structures 200a and 200b, is used to drive the moving portions of chopper mechanism 300. Top portion 302 then provides for the variable sense capacitance to modulate the input signal.

Using an interlaced finger structure provides for minimal damping induced by shear between the moving and fixed fingers. Minimal damping yields a higher beam displacement when, as will be described below, chopper mechanism 300 is driven at its resonant frequency. This increases the modulation capacitance and, thereby, the sensitivity of an amplifier employing chopper mechanism 300. While the interlaced structure described is preferable, one of skill in the art, however, will recognize that other finger topologies may be used, such as parallel plate structures (which would provide lower performance) instead of interlaced.

While chopper mechanism 300 is described with a single central beam as the center structure common to the sets of static and movable fingers, alternative configurations of the common center structure are envisioned within the scope of the present invention. One such alternative configuration uses two central conducting beams, each with their own spring mechanisms. Each of the beams would have one half of the sets of fixed and movable fingers attached thereto. The two central conducting beams would either be driven in opposite phase with the same polarity for their differential inputs or driven in phase with their differential inputs switched in polarity. Using two central beams in this manner, however, would generally be difficult in practice. Therefore, a single central beam is generally preferred over two central beams driven as described above. Another alternative configuration uses a cross-quad structure. This structure is particularly useful for improving the common mode rejection, and, as such, is described further in the section on improved common-mode rejection.

PARAMETRIC AMPLIFIER WITH CHOPPER MECHANISM

A parametric amplifier suitable for a number of applications, including an operational amplifier or an instrumentation amplifier, is formed using the inherently differential chopper mechanism 300. The unique nature of chopper mechanism 300 allows for the feedback of a signal back to the sensor through a secondary set of capacitor plates. This makes the parametric amplifier particularly suited for application as an instrumentation amplifier. By using the secondary set of plates to close a self-balanced feedback bridge, a stable ratiometric instrumentation amplifier is constructed that allows for galvanic isolation between the input terminals (cap plates) of the vibrating capacitor structure and the additional instrumentation circuitry.

Figure 4A:
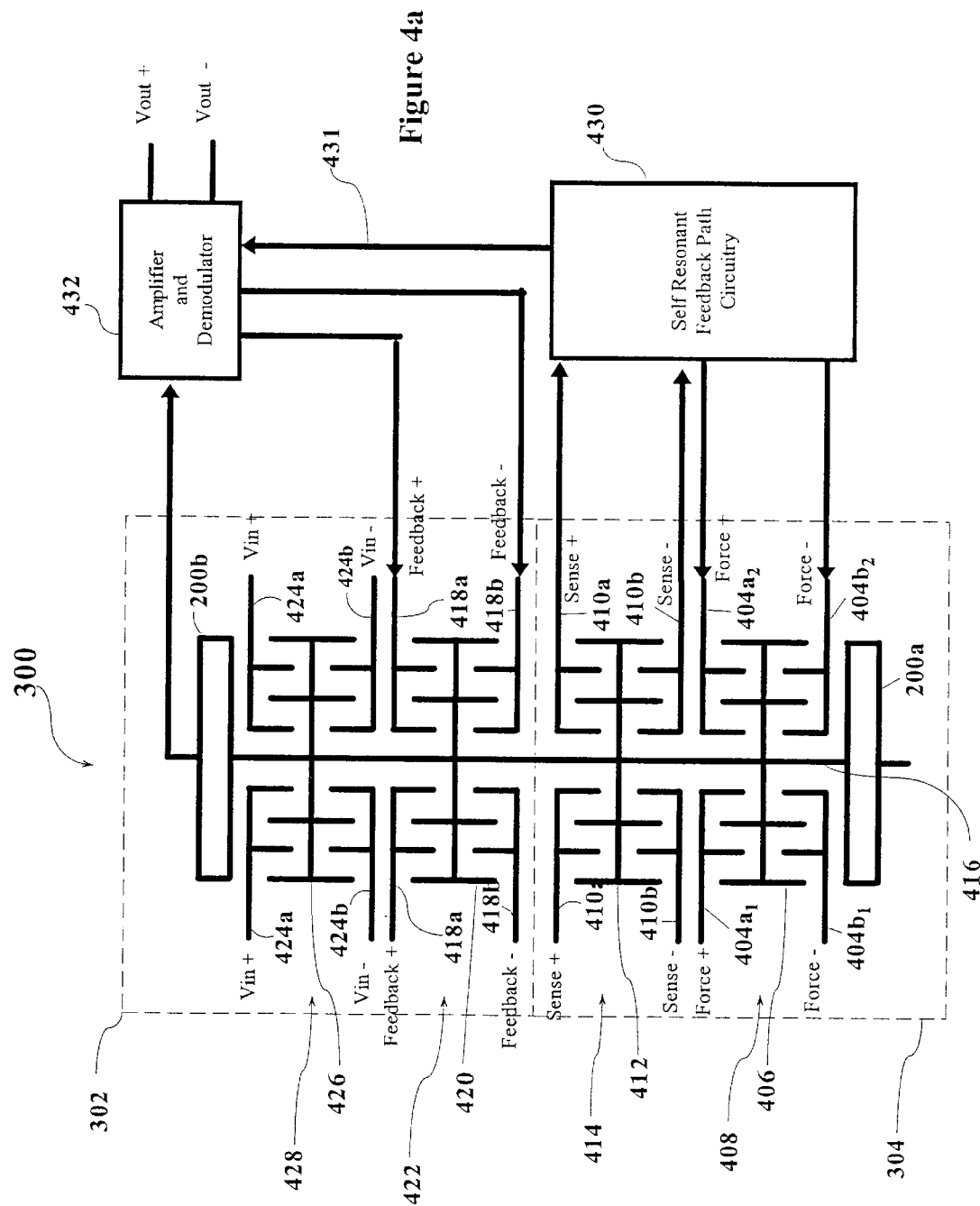
FIG. 4a generally illustrates a parametric amplifier employing the preferred chopper mechanism of FIG. 3, particularly suited as an isolated instrumentation amplifier.

FIG. 4a generally illustrates a parametric amplifier using chopper mechanism 300 employed as an isolated instrumentation amplifier. As will be explained more fully below, lower portion 304 of chopper mechanism 300 is used to oscillate the moving portions of chopper mechanism 300 (i.e., central beam 416 and attached finger structures 406, 412, 420, and 426). Preferably, lower portion 304 is part of a total feedback path including feedback circuitry 430 that provides a self-resonant feedback drive, which oscillates the moving portions at, preferably, the resonant frequency of chopper mechanism 300. The moving portions are preferably oscillated at the resonant frequency because, for an underdamped structure, operation at resonance yields maximum displacement for a given force, which results in maximum capacitance modulation and, thereby, sensitivity of the parametric amplifier. Top portion 302 receives the differential input voltage, and, due to the oscillations of the moving parts, transduces this voltage into a modulated current signal, which is output to an amplifier and demodulator section 432 via central beam 416. Amplifier and demodulator section 432 amplifies and demodulates the modulated current signal to provide an amplified output voltage. To demodulate the signal, amplifier and demodulator section 432 receives a phase reference signal 431 from feedback circuitry 430. Preferably, the output voltage is also fed back to either the top portion 302 (instrumentation amplifier) or around to the V_ inputs (op-amp), so that the accuracy of the amplified signal is decoupled from variations of the circuitry in the forward loop (i.e. amplifier and demodulator section 432). When this feedback is employed, section 432 preferably includes loop compensation to insure stability.

A. Self-Resonant Feedback Drive

Oscillation of the moving portions of chopper mechanism 300 is preferably provided using lower portion 304 and feedback path 430. In order to oscillate the moving portions, at least one interlaced finger structure 408 of lower portion 304 is used to provide a motive force. When a voltage is applied to either fixed fingers $404a_1$ and $404a_2$ or fixed fingers $404b_1$ and $404b_2$ a motive force is induced which is proportional to:

$$\frac{\varepsilon b}{g} V^2$$

Where $\varepsilon$ is the permitivity of free space, V is the voltage and, as shown in FIG. 4b, b is the thickness of the fixed fingers, $404a_1$, $404a_2$, $404b_1$ and $404b_2$ and moving fingers 406, and g is the space between the fixed fingers $404a_1$, $404a_2$, $404b_1$ and $404b_2$ and moving fingers 406. Therefore, an oscillating movement is induced parallel to the length of central conducting beam 416 when a voltage alternating between 0 and V is applied to fixed fingers $404a_1$ and $404a_2$, while a voltage is applied to fixed fingers $404b_1$ and $404b_2$ that also alternates between 0 and V, but which is 180° out of phase. These voltages are illustrated in FIG. 4c.

When applying the voltages as illustrated in FIG. 4c, however, there is a net charge induced into central beam 426. This is disadvantageous because the net charge creates an offset in the modulated current output to amplifier and demodulator section 432 via central beam 416. Furthermore, an induced net charge unduly limits the magnitude of the differential signal that can be resolved sitting on top of a common-mode voltage. It is, therefore, preferable for the voltages applied to fixed fingers $404a_2$ and $404b_2$ to alternate between 0 and −V, rather than alternating between 0 and V. This is illustrated in FIG. 4d. By providing signals of opposite polarity, the charge induced on central beam 416 by one of the signals is cancelled by the charge induced by the other signal. Thus, the net induced charge on central beam 416 is zero during a transition, while the force component remains constant since it is proportional to $V^2$.

Figure 4E:
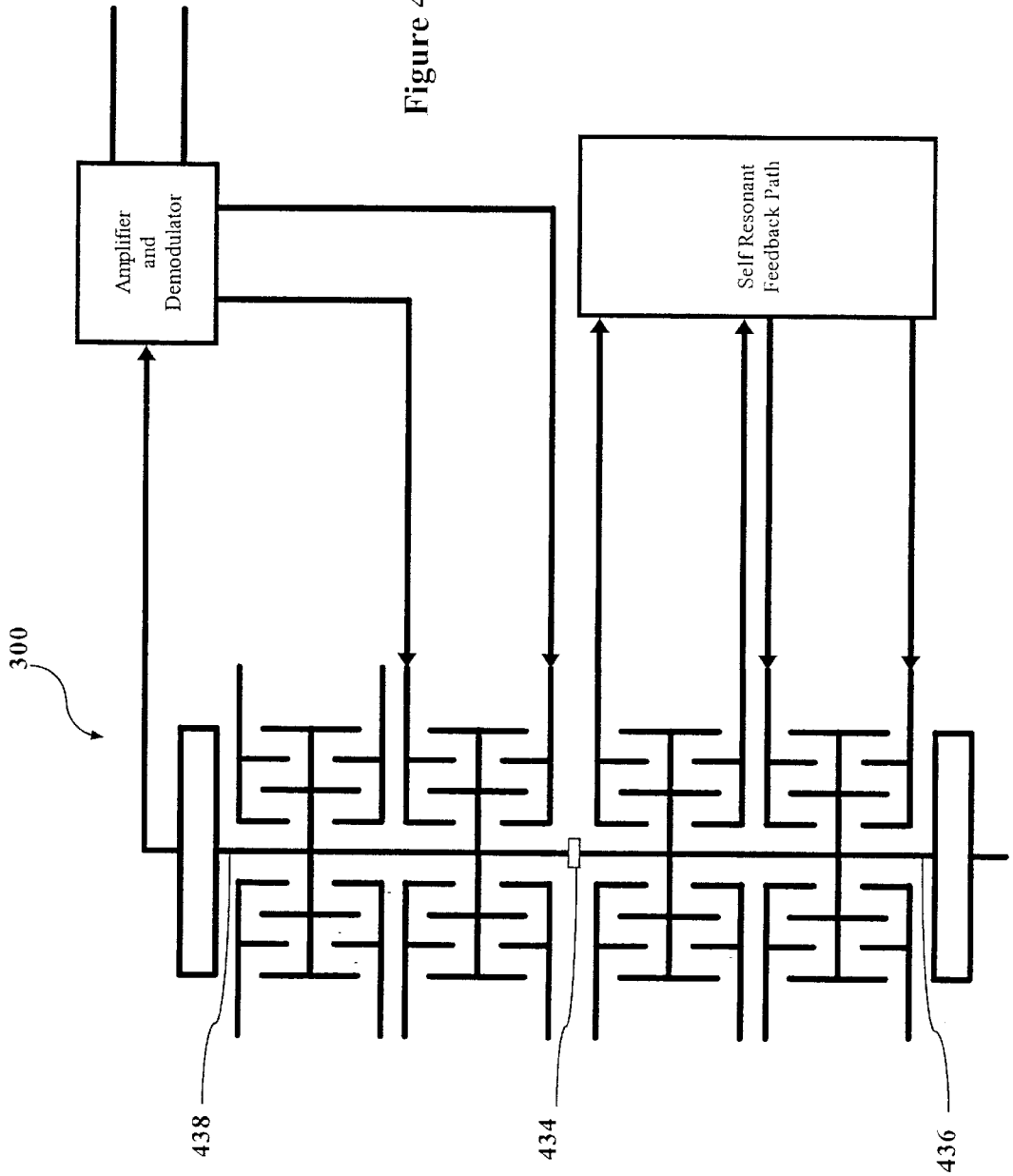
FIG. 4e illustrates an embodiment of the present invention using isolation coupling to isolate the drive signal from the output signal

Alternatively, or in addition, to using signals of opposite polarity, an isolation coupling is used to isolate the net charge. Therefore, in another embodiment of the present invention, illustrated in FIG. 4e, an isolation coupling 434 is provided, which mechanically couples upper portion 438 of central beam 416 to lower portion 436 of central beam 416, while providing electrical isolation there between. When chopper mechanism 300 is micromachined in silicon, isolation coupling 434 is preferably a nitride/polysilicon isolation trench, similar to that described above.

Referring again to FIG. 4a, to provide the oscillations, a differential force feedback control signal is applied to lower portion 304 by applying a first force feedback voltage, Force+, to fixed fingers $404a_1$ and $404a_2$ of interlace finger structure 408, and a second force feedback voltage, Force−, to fixed fingers $404b_1$ and $404b_2$. These signals alternate, preferably, in the manner that was illustrated in FIG. 4d, which causes central beam 416 and the other attached finger structures 412, 420, 426 to oscillate parallel to the length of central beam 416.

It is preferable to drive chopper mechanism 300 so that these oscillations are at the resonant frequency of chopper mechanism 300. By driving chopper mechanism 300 at its resonant frequency, the largest signal-to-noise ratio and maximum modulation capacitance is obtained because, as previously described, operation at resonance yields maximum displacement for a given force. To provide control of the oscillations, feedback path 430 measures the currents induced on fixed fingers 410a and 410b by the movement of fingers 412 of interlaced finger structure 414. These differential currents represent the velocity of central beam 416 and attached finger structures 406, 412, 420, 426. Self resonant feedback path 430 uses these currents to adjust the frequency of force feedback control signals, Force+ and Force−, so as to obtain a resonant oscillation of central beam 416 and finger structures 412, 420 and 426.

Figure 5:
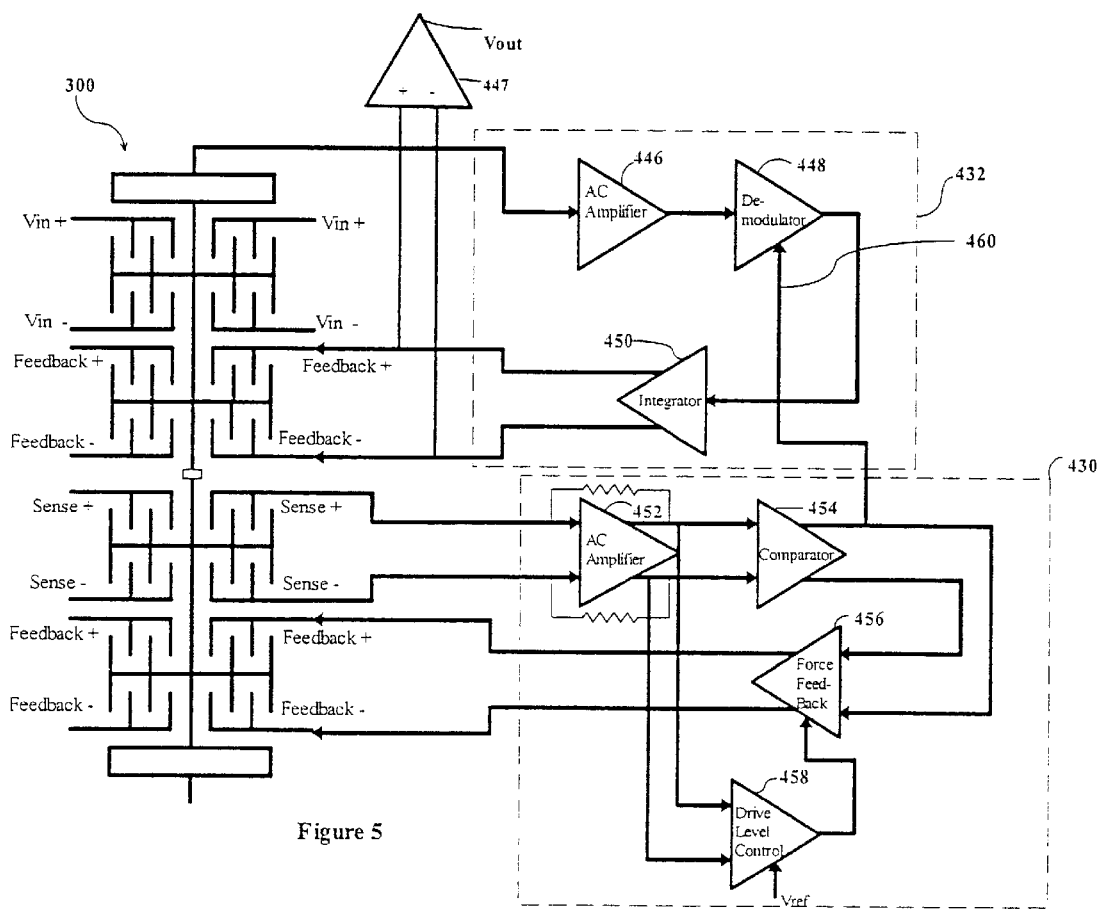
FIG. 5 illustrates preferred embodiments of the self-resonant feedback drive and self-balanced bridge.

An implementation of self-resonant feedback path 432 is illustrated in FIG. 5. An ac transresistance amplifier 452 is used to amplify the movement induced current signals, sense+ and sense−, from sense outputs 410a and 410b, respectively. As stated, these induced currents are proportional to the velocity of the moving portions of chopper mechanism 300. The output of ac amplifier 452 is provided to comparator 454. Output from comparator 454 is provided to a feedback signal conditioner 456 that provides the necessary voltage drive to the feedback structure of chopper mechanism 300 to drive the moving portion.

This loop will oscillate chopper mechanism 300 at its resonant frequency. According to the Barkhausen criterion, the net phase around the loop must be zero to induce an oscillation. The velocity is in phase with the applied force only at the resonance frequency. Thus by measuring velocity and providing feedback proportional to the velocity, chopper mechanism 300 is oscillated at its resonant frequency.

In addition to driving chopper mechanism 300 at its resonant frequency, it is also preferable to control the signal level of the force feedback signals to stabilize the excursion of the moving portion of chopper mechanism 300. Otherwise, the displacement of central beam 416 and attached finger structures 406, 412, 420, 426 is only limited by the shear damping between the fixed and moving fingers. To control the magnitude of the force feedback signals, the output from ac amplifier 452 is also provided to a signal conditioner 458. In addition, conditioner 458 receives a reference voltage signal, $V_{ref}$, which represents the target displacement of the moving portion of chopper mechanism 300. Based upon these inputs, conditioner 458 generates a signal that is provided to feedback signal conditioner 456. This signal controls feedback signal conditioner 456, such that feedback signal conditioner 456 adjusts the level of the force feedback signal to insure the moving portion of chopper mechanism 300 is not displaced farther than the maximum desirable displacement. Controlling the level of the force feedback signals is preferable because it helps to keep the chopper mechanism within the mechanical structures linear region of motion. For example, if the chopper mechanism is operated in a vacuum for ultra-high voltage and/or high sensitivity applications, this control provides a control mechanism to stop the moving portion of chopper mechanism 300 from being displaced beyond the linear range of the mechanical springs, or, possibly more importantly, to prevent the collision of the moving finger structures with the fixed finger structures.

B. Input Sense Section and Self Balanced Bridge

Top portion 302 receives the differential input voltage and transduces this voltage into a modulated charge signal for amplification. A differential voltage to be measured applied to fixed fingers 424a and 424b. At the same time, oscillations of fingers 426 act to vary the capacitance between fixed fingers 424a and fingers 426, in addition to the capacitance between fixed fingers 424b and fingers 426. This causes a charge to be induced in central beam 416 that is representative of the input differential voltage modulated by the varying capacitances. This charge variation creates a current (or voltage, depending on the characteristics of the amplifier in the amplifier and demodulator section 432).

The current induced in central beam 416 is provided to an amplifier and demodulator section which amplifies the modulated input signal, demodulates it and preferably conditions the demodulated signal to provide a conditioned differential output, as $V_{out+}$ and $V_{out-}$, which is an amplified representation of the differential input.

While this interface circuitry can be used open-loop, it is preferable to implement a feedback loop to create a self-balanced bridge, which compensates for variations in phasing during demodulation, variations of the gain of the amplifier circuitry, and variations of the capacitance modulation from mechanical chopper 300, among other possible sources of error.

As will be illustrated below, additional disturbances occur from a parasitic frequency weighting when the chopper mechanism modulates an input signal. Disturbances resulting from the frequency weighting term are a primary error source that is also suppressed by employing a self-balanced bridge. Using feedback to create a self-balanced bridge linearizes the transfer function of chopper mechanism 300, eliminating disturbances from the frequency weighting term. If the interface circuitry is used open-loop without the self-balanced bridge, disturbances from the frequency weighting term can be made negligible by insuring that the modulation frequency of the capacitance is significantly greater than the signal's bandwidth. Insuring that the modulation frequency is significantly greater than the signal's bandwidth can be accomplished by limiting the frequency content of the input signal via a filter and/or by providing a very high resonant frequency chopper mechanism. Limiting the frequency content of the input signal is undesirable and providing a very high resonant frequency chopper mechanism is often difficult. Therefore, creation of the self-balanced bridge through feedback is particularly desirable to suppress disturbances resulting from the frequency weighting term.

In addition to suppressing disturbances from the frequency weighting terms, creating the self-balanced bridge decouples the accuracy of the amplified signal from variations of the interface circuitry, and rather, depends only on the matching of the physical modulation capacitors of structure 428. The feedback loop functions to cancel out any net charge induced in central beam 416. The effects of variations in the forward loop (mechanical chopper dimensions, ac amplifier, demodulator) are then limited to changes in noise performance and amplifier bandwidth. The accuracy of the differential measurement signal remains constant when the feedback is used.

There are two ways to provide feedback to create the self-balanced bridge and, thereby, suppressing disturbances from the frequency weighting term and decoupling the sensitivity from variations in the interface circuitry. The first way is to feed back a single-ended output of the amplifier to the V− input. This topology is generally useful for operational amplifier topologies and is discussed below under the section on additional applications. The second topology uses internal feedback within the chopper structure by providing shunt capacitances that the differential output of the amplifier is fed back to. This topology is highly useful, and, therefore, is typically the most desirable manner of forming the self-balanced bridge. The second manner of creating the self-balanced bridge is illustrated in FIG. 4a.

As shown, to provide the internal feedback, a grouping of shunt modulation capacitances are provided by interlaced finger portion 422. By applying the conditioned differential output as feedback+ and feedback− to fixed fingers 418a and 418b, respectively, a feedback loop is closed which creates the self-balanced bridge.

The use of the self-balanced bridge creates a robust instrumentation amplifier topology that is highly immune to micromachining and electronics processing variations. The self-balanced bridge provides for a stable gain of the instrumentation amplifier that is given by the ratio of the sets of the input fingers to the sets of feedback fingers. For instance, in the present illustration, the gain is 1, as there is a single interlaced finger structure 428 receiving the differential input voltage and a single interlaced finger structure 422 for the differential feedback input. If there were a hundred interlaced finger structures like structure 428, each receiving the differential input voltage and only the single interlaced finger structure 422 for the differential feedback input, the gain would be 100. In a like manner, rather than providing a stable gain, the instrumentation amplifier can provide a stable attenuation by providing more feedback fingers than input fingers. For instance, if there were a hundred interlaced finger structures like structure 422, each receiving the differential feedback input, and only the single interlaced finger structure 428 for the differential input voltage, the differential input voltage would be attenuated by a factor of 100. This allows the instrumentation amplifier to measure high voltages and attenuate them for interfacing to standard circuits. This is useful, for example, in xerographic machines and x-ray power supplies, which need to measure +/−1500V dc signals and interface the measurement to a microcomputer with a +/−15V power supply. It should also be noted that gain could be achieved by attenuating the internal feedback signal, such as with a voltage divider.

An implementation of amplifier and demodulator section 432 including feedback to form the self-balanced bridge is illustrated in FIG. 5. As previously described, the modulated current induced in chopper mechanism 300 from the oscillations of the moving parts and the differential input voltage is provided to amplifier and demodulator section 432. Amplifier and demodulator section 432 includes ac amplifier 446, which amplifies the modulated current. Demodulator 448 demodulates the differential amplified signal output from amplifier 446 in phase with the chopper mechanism's motion. Phasing information is provided at 460 from the self-resonant feedback path 430. Output from demodulator 448 is then passed to an integrator 450, or other appropriate loop compensation and conditioning mechanism. The output of integrator 450 is provided to the inputs of difference amplifier 447. Difference amplifier 447 provides the output of the instrumentation amplifier as $V_{out}$. The output of integrator 450 is additionally fed back to the feedback inputs, feedback+ and feedback−, of chopper mechanism 300 to cancel the net induced charge on the central beam of chopper mechanism 300.

The self-balanced bridge implemented with feedback to the chopper mechanism provides for galvanic isolation between the input terminals (cap plates) of vibrating capacitor structure 300 and circuitry of the forward loop. Galvanic isolation means that the input voltages, $V_{in+}$ and $V_{in-}$, can float with respect to the grounds of the circuitry in the forward loop with minimal performance degradation of the differential measurement.

It should be noted that, in order to keep the referred-to-input (RTI) noise of the parametric amplifier at a minimum, it is preferable that ac amplifier 446 is a low-noise design, with its 1/f corner below the chopper mechanism's modulation frequency. This is because the RTI noise is determined, at a minimum, by the noise of ac amplifier 446 at the chopper mechanism's modulation frequency weighted by the ratio of the total shunt capacitance at the ac amplifier 446 input to the modulation capacitance of structure 302. As such, parasitic capacitance and static capacitance should also be kept at a minimum, while the modulation capacitance maximized, to avoid significant noise gain.

In addition, the gain of amplifier 446 is preferably high enough to insure large offsets are not created in the presence of larger differential signals. As will be appreciated by one of skill in the art, the offset is approximately equal to $$\frac{V_i}{A_0(f)\beta},$$

where $A_0$ is the forward amplifier gain, $\beta$ is the feedback attenuation ratio and $V_i$ is the input voltage. Therefore, given a specific design criteria, the gain of amplifier 446 can be chosen to insure the offset is below a maximum offset for a given magnitude of the differential signals. For example, if an offset of less than 1 $\mu V/V_{in}$ is desired for a closed loop gain of 10, the amplifier gain will be approximately 10,000,000 or greater.

IMPROVED COMMON MODE REJECTION

Alternate embodiments of the present invention provide for increased rejection of common mode errors. The current produced by chopper mechanism 300 is given by:

$$I_+ = C\frac{dV}{dt} + V\frac{dC}{dt} = j\omega_c e^{j\omega_c t}(V_a C_{sa} - V_b C_{sb}) + $$
$$(C_{oa} + C_{ob})\frac{d(V_a + V_b)}{dt} + e^{j\omega_c t}\left(C_{sa}\frac{dV_a}{dt} - C_{sb}\frac{dV_b}{dt}\right)$$

Where the modulation capacitances $C_a$, between fixed fingers 424a and node 462, and $C_b$, between fixed fingers 424b and node 462, have been expanded into constant capacitance terms, $C_{oa}$ and $C_{ob}$, and sinusoidal capacitance terms, $e^{j\omega_c t}C_{sa}$ and $e^{j\omega_c t}C_{sb}$. The voltage $V_a$ is the voltage between $V_{in+}$ and node 462, while the voltage $V_b$ is the voltage between $V_{in-}$ and node 462. The frequency $\omega_c$ is the chopper modulation frequency.

The term $j\omega_c e^{j\omega_c t}(V_a C_{sa} - V_b C_{sb})$ results from $$V\frac{dC}{dt},$$

which is the modulated differential input. The other terms, $$(C_{oa} + C_{ob})\frac{d(V_a + V_b)}{dt} + e^{j\omega_c t}\left(C_{sa}\frac{dV_a}{dt} - C_{sb}\frac{dV_b}{dt}\right),$$

result from $$C\frac{dV}{dt}.$$

The $$(C_{oa} + C_{ob})\frac{d(V_a + V_b)}{dt}$$

term represents a common mode disturbance resulting from the time rate change of the common mode voltage coupled into the interface circuitry through the capacitances. The $$e^{j\omega_c t}\left(C_{sa}\frac{dV_a}{dt} - C_{sb}\frac{dV_b}{dt}\right)$$

term is an additional frequency weighting term of the differential voltage rate of change modulated by the vibrating capacitances. This additional frequency weighting term is the one whose effects are reduced or eliminated by the use of feedback in a self-balanced bridge.

While a differential anti-aliasing filter can remove differential frequency content above the range of the desired signal, it is inefficient at removing the time varying common mode voltages above the range of the desired signal. As such, it is possible for these signals to be aliased into the desired signal upon modulation by the chopper mechanism. The parametric amplifier is also susceptible to static common-mode disturbances coupled into the modulated differential input, $j\omega_c e^{j\omega_c t}(V_a C_{sa} - V_b C_{sb})$, through a mismatch in the sinusoidal capacitances. For some applications a greater immunity from common-mode disturbances is desired, even if an anti-aliasing filter that rejects common mode is used. Or, as described above, in some applications it is desirable to use a differential anti-aliasing filter while relying on the amplifier to reject the common mode. Thus, alternate embodiments, as described below, provide for increased rejection of common mode errors.

A. Common Mode Disturbances From Time Rate Change of Common Mode Voltage

Figure 6:
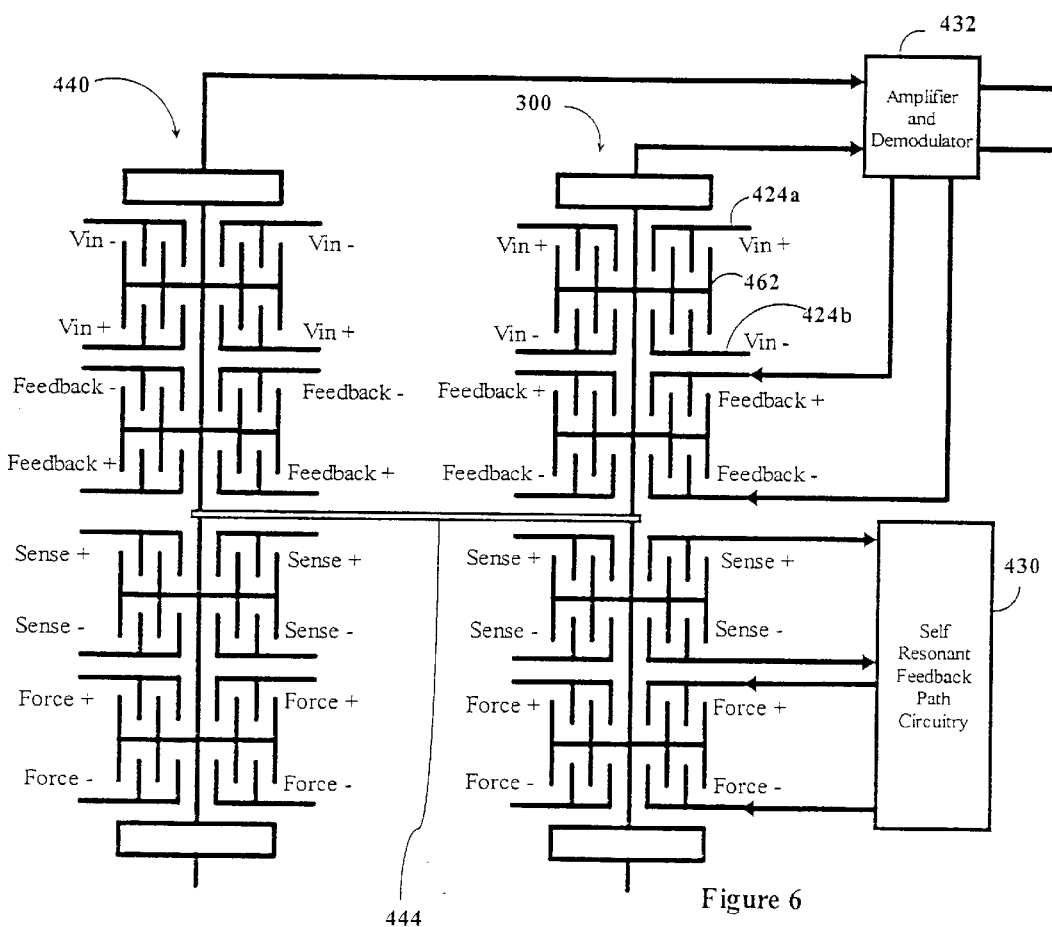
FIG. 6 illustrates an embodiment for reducing common mode disturbances due to the time varying common mode voltage and improves the common mode rejection.

FIG. 6 illustrates an embodiment of the present invention that reduces common mode errors resulting from the time rate change of the common mode voltage. In this embodiment, two chopper mechanisms 440 and 300 are provided. Chopper mechanisms 440 and 300 are connected via a single electrical isolation coupling 444 similar to that of FIG. 4e. This single electrical isolation coupling 444 acts to electrically isolate the drive portion of each structure from the variable capacitance portion, while at the same time insuring that the moving parts of the structures move in tandem when driven. The force feedback inputs, Force+ and Force−, of both structures are of the same polarity and are received by feedback path 430, while the sense outputs, sense+ and sense−, are of the same polarity and provide an output representative of the velocity of the structure to feedback path 430.

While the inputs and outputs of the drive structures of both chopper mechanisms 440 and 300 are of the same polarity, as shown, the polarities of the signal inputs, $V_{in+}$ and $V_{in-}$, are reversed for the two mechanisms 440 and 300. In addition, the feedback inputs, feedback+ and feedback−, of each mechanism 440 and 300 are also reversed.

By reversing the signal inputs, $V_{in+}$ and $V_{in-}$, and the feedback inputs, feedback+ and feedback−, the polarity of the current induced by the differential signal of interest in chopper mechanism 300 is opposite in sign from that induced in chopper mechanism 440. The polarity of the current induced by the common mode sources in chopper mechanism 300, however, will be the same sign as that induced in chopper mechanism 440. Therefore, by passing the signals from chopper mechanism 300 and chopper mechanism 440 into different inputs of a differential amplifier in amplifier and demodulator portion 432, the common mode signals are cancelled out, providing greater immunity to common-mode disturbances.

To illustrate, as previously described, the current produced by chopper mechanism 300 is given by:

$$I_+ = C\frac{dV}{dt} + V\frac{dC}{dt} = j\omega_c e^{j\omega_c t}(V_a C_{sa} - V_b C_{sb}) + $$
$$(C_{oa} + C_{ob})\frac{d(V_a + V_b)}{dt} + e^{j\omega_c t}\left(C_{sa}\frac{dV_a}{dt} - C_{sb}\frac{dV_b}{dt}\right)$$

By reversing the polarity of the input signals, $V_{in+}$ and $V_{in-}$, on chopper mechanism 440, however, the current produced is:

$$I_- = C\frac{dV}{dt} + V\frac{dC}{dt} = j\omega_c e^{j\omega_c t}(V_b C_{sb} - V_a C_{sa}) + $$
$$(C_{oa} + C_{ob})\frac{d(V_a + V_b)}{dt} + e^{j\omega_c t}\left(C_{sb}\frac{dV_b}{dt} - C_{sa}\frac{dV_a}{dt}\right)$$

This maintains the time rate change of the common-mode voltage coupled through the constant capacitances, $$(C_{oa} + C_{ob})\frac{d(V_a + V_b)}{dt},$$

at the same sign, while the modulated differential input switches polarity. By passing these signals to a differential transresistance amplifier of amplifier and demodulator section 432, the total current output by the differential transresistance amplifier is then given by:

$$I_{total} = j\omega e^{j\omega t}C_s(V_a - V_b) + e^{j\omega_c t}C_s\frac{d(V_a - V_b)}{dt}.$$

Since, ideally $C_{sa}=C_{sb}$, they have replaced by a single variable $C_s$, which is factored out. As can be seen, the common mode disturbances from the time rate change have been removed. Because of the self-balanced bridge (or when the modulation frequency of the capacitances is maintained significantly greater than the signal's bandwidth), the non-linear distortion term is not of concern. When the self-balanced bridge is used, the feedback has the same scaled, frequency weighting term, which ratiometrically cancels out the distortion term in the equation above.

B. Common Mode Disturbances From Capacitance Mismatches

As previously described, common mode disturbances also result from mismatches in the finger structures. In the presence of small physical differences between the input fingers of interlaced finger structure 428, a small current resulting from the common mode voltage and the mismatched fingers is superimposed into the modulated differential input signal. Even using an embodiment employing the self-balanced bridge, an error results because the self-balanced bridge has no method of discriminating between the nominal modulated current from the differential input and the modulated current from the common-mode voltage reacting with mismatched capcitances. Errors resulting from mismatches can be reduced through a number of techniques. One technique is to measure the common mode's signal level, and then using that measurement to inject the required compensation signal into the primary signal path. Another is to mechanically adjust the capacitances of the fixed fingers used for the differential input signal. Yet another technique is the use of a cross-quad structure.

1. Measuring Common Mode and Injecting Compensation Current

Figure 7A:
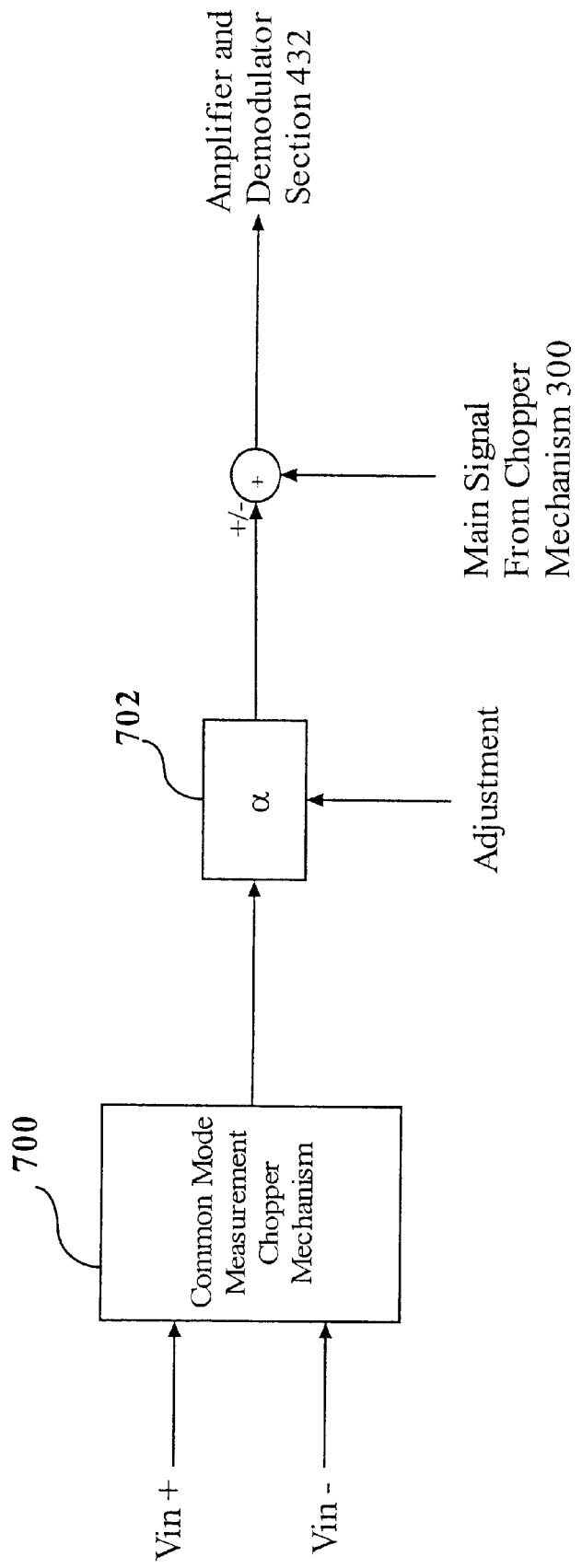
FIGS. 7a and 7b illustrate an embodiment for reducing common mode disturbances due to mismatches in finger capacitances by injecting a compensation signal into the modulated differential input signal.

FIG. 7a illustrates an embodiment for measuring the common mode signal level and injecting a compensation signal into the signal path. A separate measurement chopper mechanism 700 similar to chopper mechanism 300, or mechanisms 300 and 440 in the embodiment for reducing disturbances from the time varying common voltage, also receives the differential input signal as $V_{in+}$ and $V_{in-}$. Measurement chopper mechanism 700 uses the input signals to measure and output a signal representative of the common mode. Appropriate circuitry 702 then scales this current by α ratio a to adjust the magnitude of this current. This adjusted current is then injected to the main signal from chopper mechanism 300, or from mechanisms 300 and 440. By adjusting the magnitude of the current through adjustment of the ratio α, the common mode error caused by mismatches is nulled out of the main signal to first order.

Figure 7B:
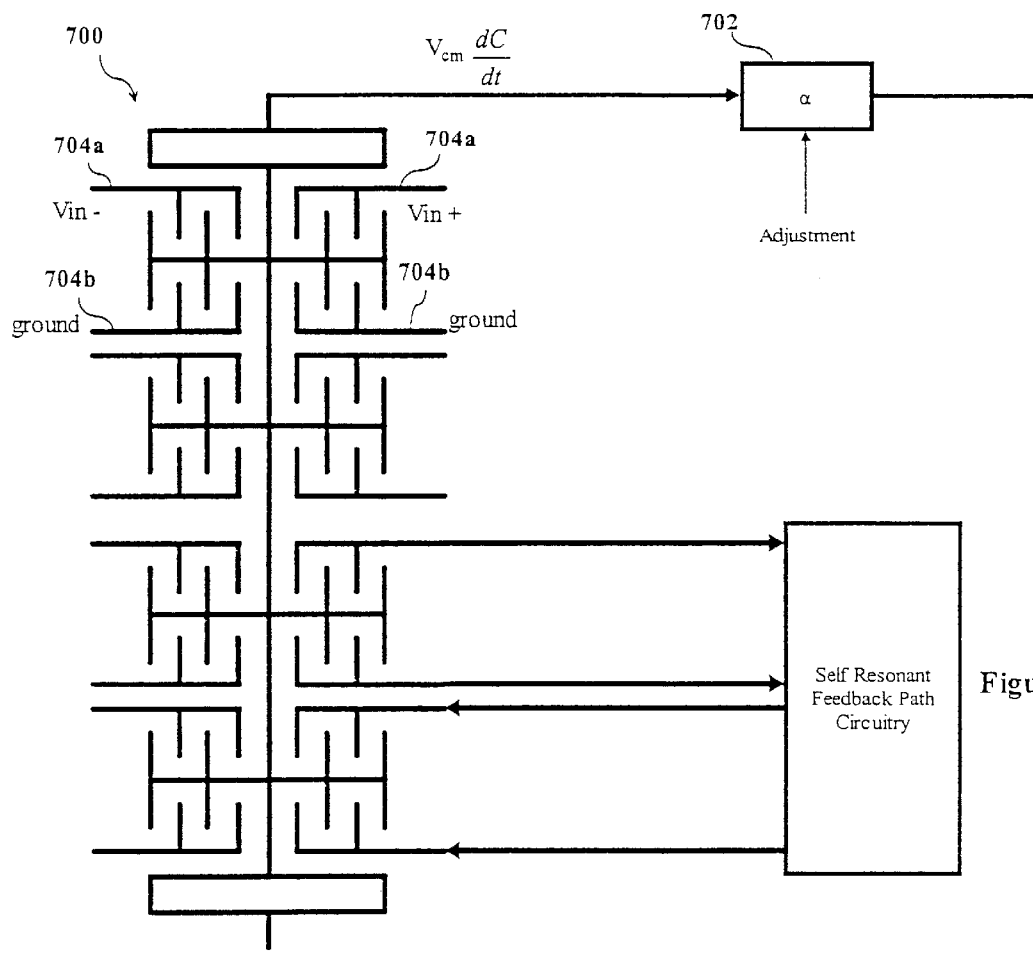

FIG. 7b illustrates an embodiment of measurement chopper mechanism 700 for measuring the common mode disturbance resulting from mismatches in the capacitances. Chopper mechanism is fashioned in the same manner as the other chopper mechanism(s) used to modulate the differential input signal. The differential input signal, however, is applied to the top set of fixed fingers by applying $V_{in+}$ to one of the fixed fingers, while applying $V_{in-}$ to the other. Chopper mechanism is driven at the same frequency as the input signal modulating chopper mechanism(s). This produces an ideal current:

$$I = C\frac{dV}{dt} + V\frac{dC}{dt} = C\frac{dV}{dt} + (V_{cm} + \Delta)\frac{dC/2}{dt} + (V_{cm} - \Delta)\frac{dC/2}{dt},$$

where Δ is the differential voltage and $V_{cm}$ is the common mode voltage. Current from the $$C\frac{dV}{dt}$$

term is made negligible similar to the uncancelled common mode disturbances resulting from the time rate change of the common mode voltage. Therefore, the pertinent ideal current output to circuitry 702 is:

$$I = V_{cm}\frac{dC}{dt}.$$

Due to items such as process variations, circuitry 702 preferably scales this current by an adjustable compensation factor α. To find the proper compensation factor, a large common-mode signal is applied to the fingers and the error signal measured. The compensation factor is then adjusted to null the common-mode error signal out.

2. Adjusting Capacitance of Fingers

Figure 8:
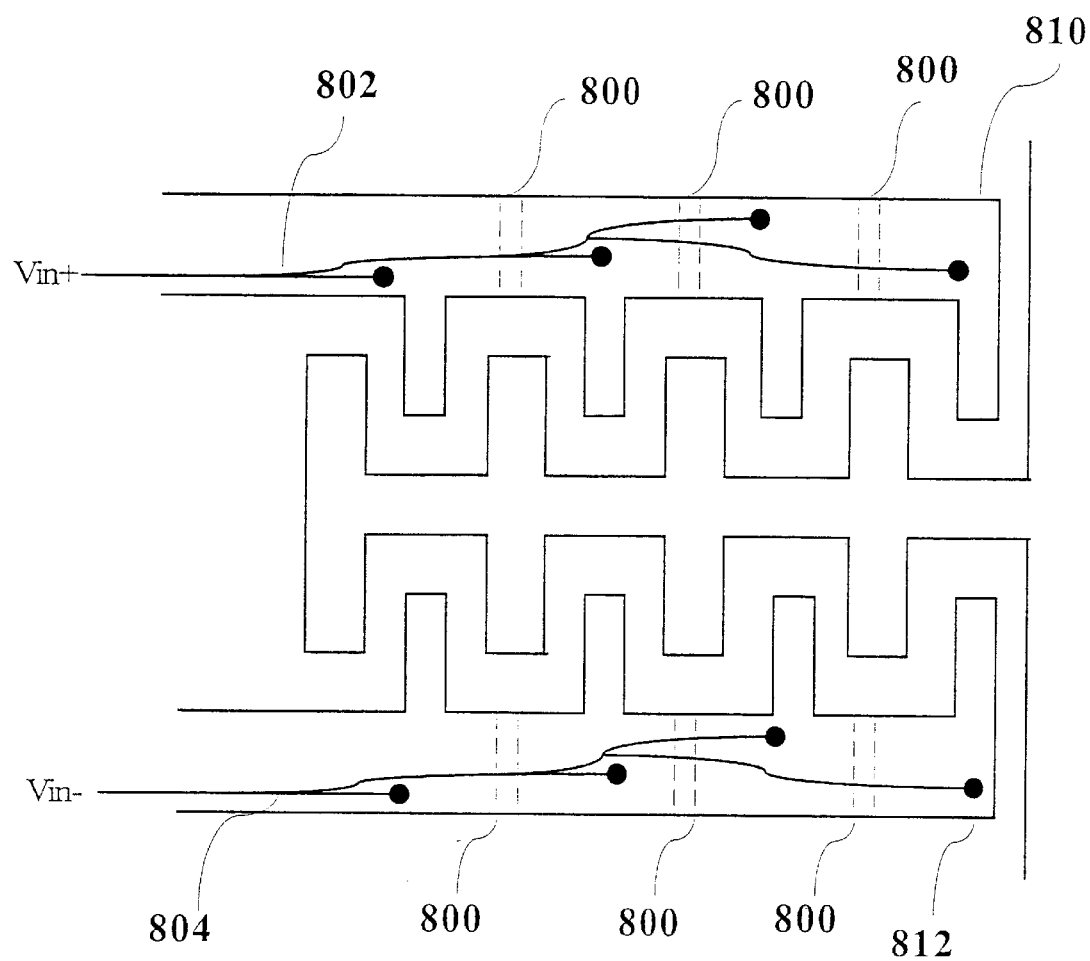
FIG. 8 illustrates another embodiment for reducing common mode disturbances due to mismatches in finger capacitances by mechanically adjusting the capacitances of the fingers.

FIG. 8 illustrates an embodiment for adjusting the capacitance of the fixed fingers used for the differential input. Illustrated is a close-up of one of the interlaced finger structures of the chopper mechanism(s) for receiving the differential input signal. Each of the fixed fingers is electrically isolated using, for example, standard isolation trenches when the chopper mechanism is micromachined on silicon. A plurality of metal lines 802 for receiving $V_{in+}$ are formed on fixed finger structures 810. Each of the plurality of metal lines terminates at a different one of the fixed fingers. Likewise, a plurality of metal lines 804 for receiving $V_{in-}$ are formed on fixed finger structure 812, with each of the lines terminating at a different fixed finger of structure 812. By cutting a metal line, the fixed finger the cut line terminates at is isolated from the input signal, and no longer contributes to the capacitance of the structure. Therefore, the capacitance of either fixed finger structure 810 or fixed finger structure 812 is adjusted by removing fixed fingers from the corresponding structure until there is no longer a mismatch in capacitance. By adjusting the capacitance of all the interlaced finger structures receiving the differential input in the same manner, the common mode error resulting from a mismatch in capacitance is eliminated.

3. Cross-Quad Structure

Figure 9A:
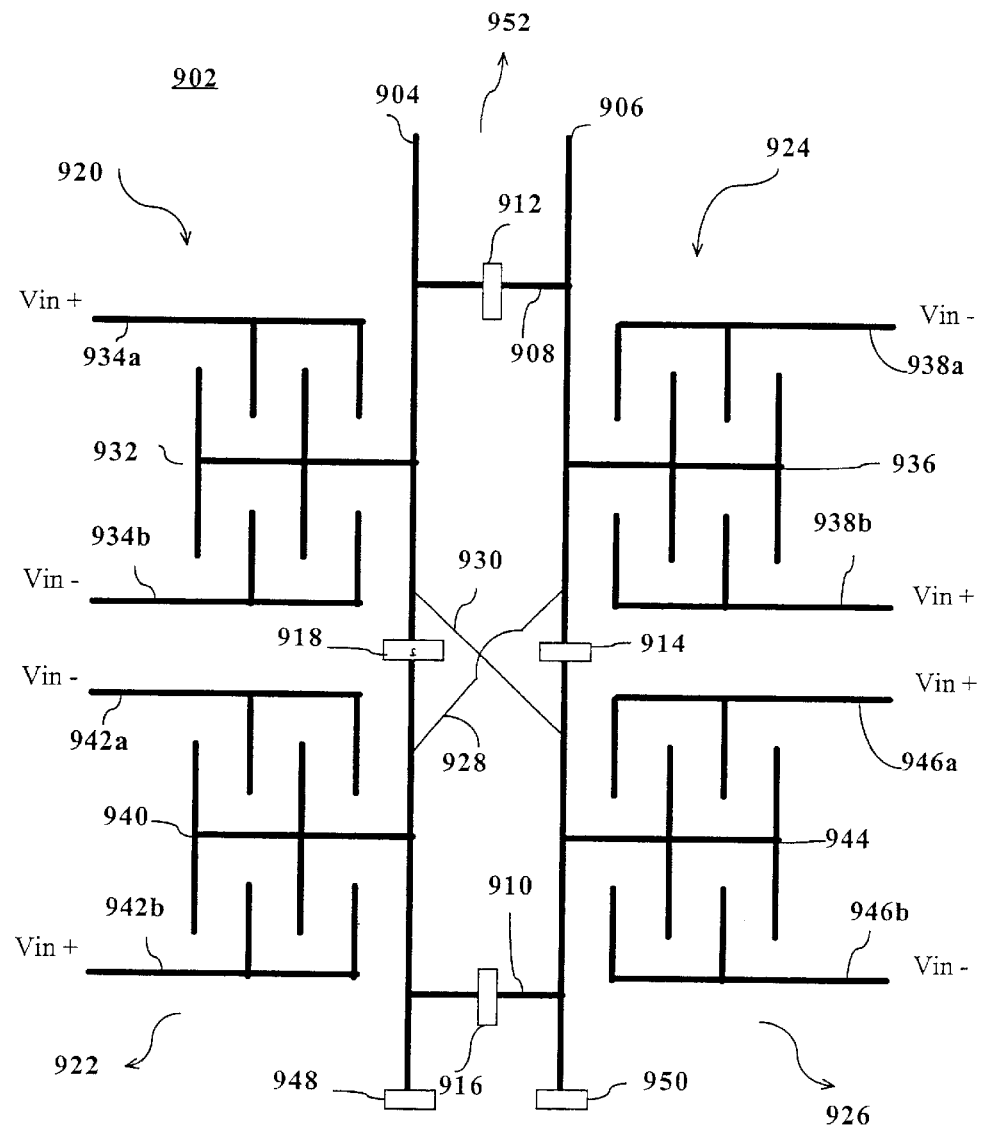
FIGS. 9a–9c illustrate the use of a cross quad structure.
Figure 9B:
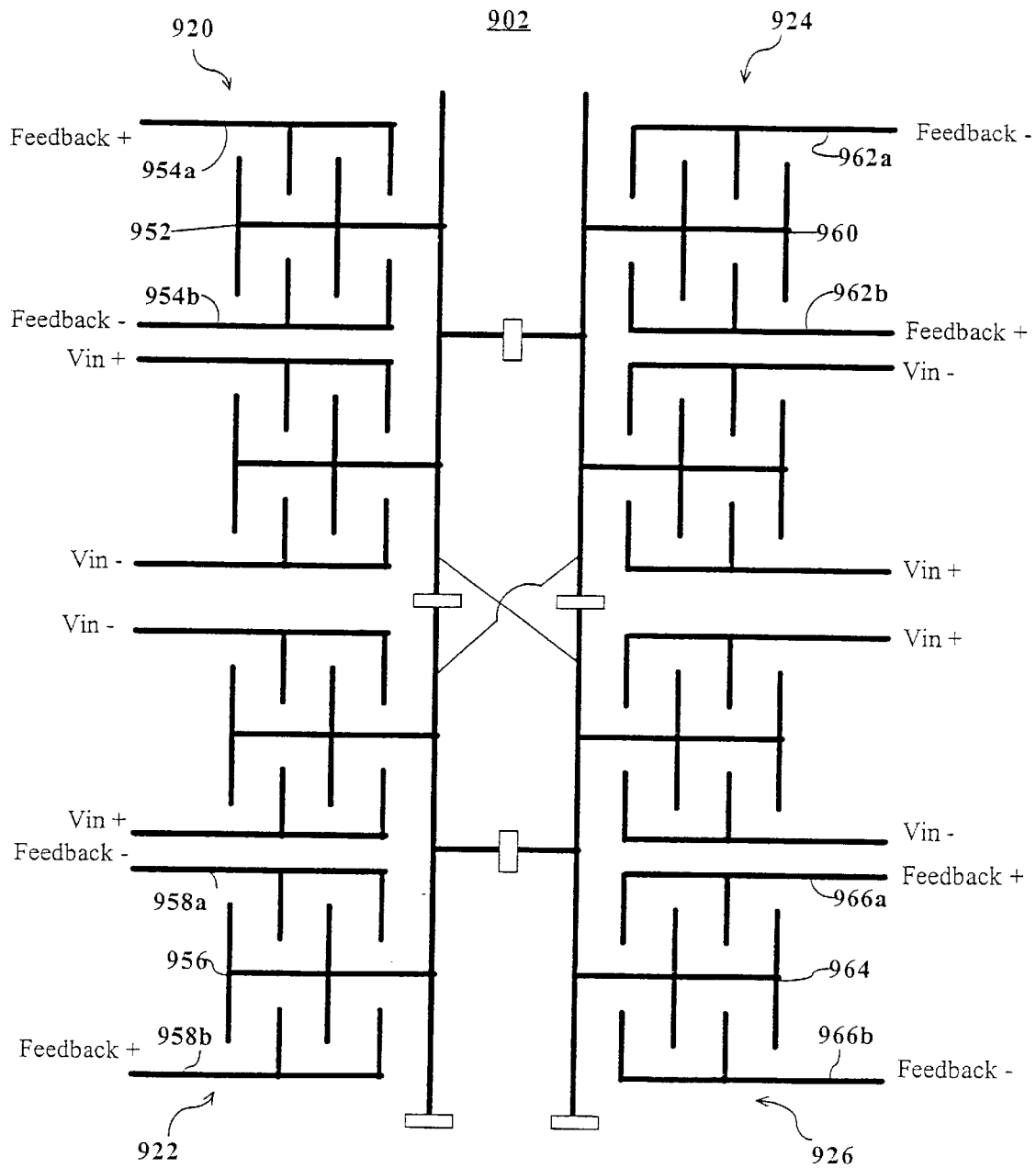
Figure 9C:
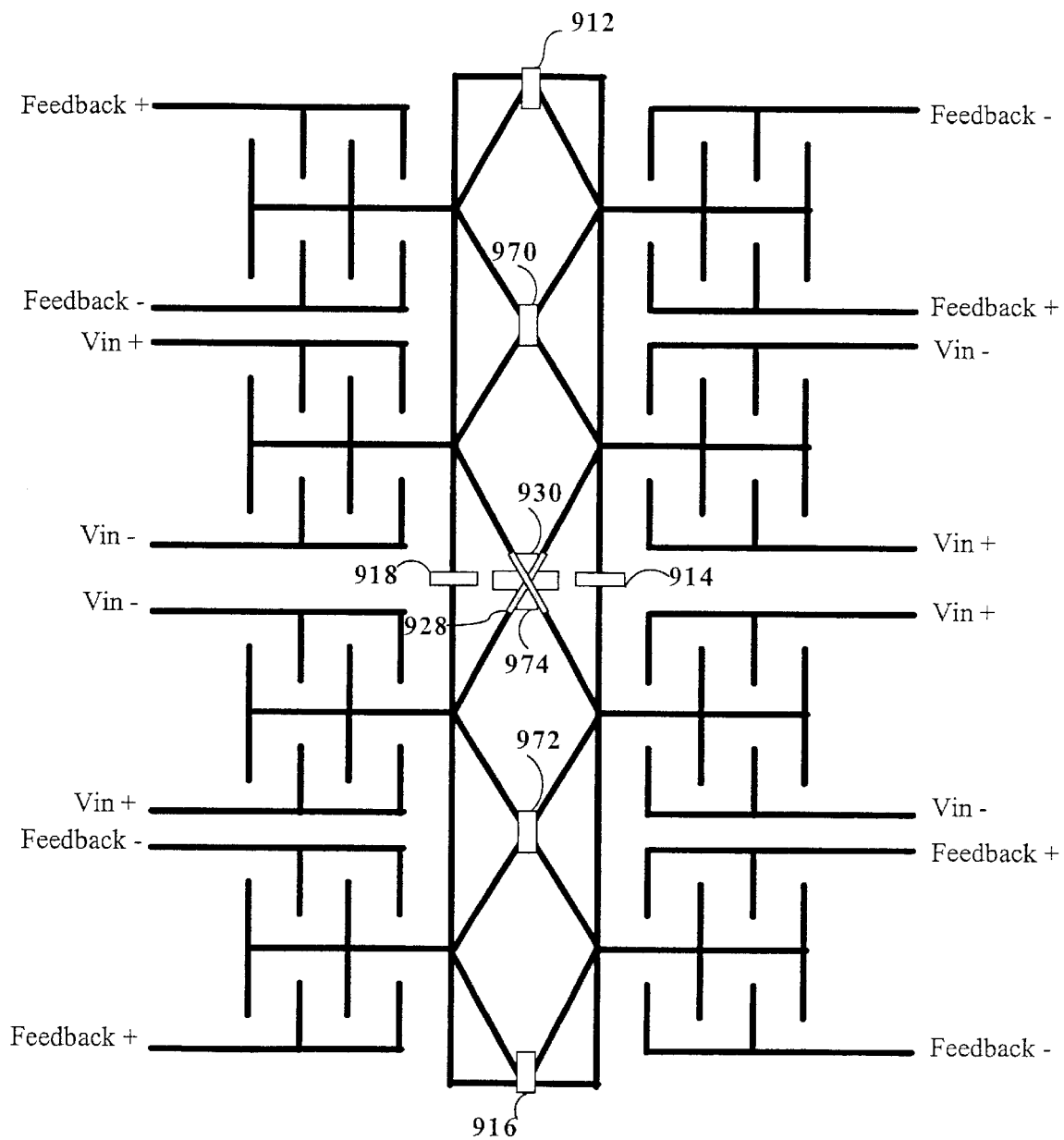

The differential rejection of common mode disturbances as described in FIG. 6 can further be enhanced with a cross-quad structure. FIGS. 9a–9c illustrate the use of a cross-quad structure, which eliminates offset sensitivity to linear etch gradients across a silicon wafer when the mechanical chopper is micromachined in silicon. This reduces errors from mismatches, thereby improving common-mode rejection. The cross-quad structure is a common integrated circuit layout technique in analog circuits and is described in "Analog Integrated Circuit Design" by David Johns and Ken Martin.

FIG. 9a shows a variable capacitance portion 902 of a mechanical chopper mechanism with a cross-quad structure for op-amp topologies, i.e. when internal feedback is not desired. When designed for op-amp topologies, the movable and fixed fingers for internal feedback are not needed.

Movable fingers 932, 936, 940 and 944 are connected to common center structure 952, which comprises a first central beam 904 and a second central beam 906 mechanically connected by, for example, two cross beams 908 and 916. Movable fingers 932 and 940 are connected to a first central beam 904. Fixed fingers 934 are interlaced with movable fingers 932. Fixed fingers 934a receive the $V_{in+}$ input, while fixed fingers 934b receive the $V_{in-}$ input. Similarly, fixed fingers 942 are interlaced with movable fingers 940. Fixed fingers 942a receive the $V_{in-}$ input, while fixed fingers 942b receive the $V_{in+}$ input.

Movable fingers 936 and 944 are connected to a second central beam 906. Fixed fingers 938 are interlaced with movable fingers 936. Fixed fingers 936a receive the $V_{in-}$ input, while fixed fingers 936b receive the $V_{in+}$ input. Similarly, fixed fingers 946 are interlaced with movable fingers 944. Fixed fingers 946a receive the $V_{in+}$ input, while fixed fingers 946b receive the $V_{in-}$ input.

Isolation couplings 912, 914, 916 and 918 electrically segregates variable capacitance portion 902 into four units, each with a set of movable fingers and their corresponding central beam portion. Electrical connections 928 and 930 electrically connect these four units into two pairs such that units with the same polarity of the differential input voltage are electrically connected together. That is, units 920 and 926 are electrically connected, while units 922 and 924 are electrically connected.

The current induced by movable fingers 932 and 944 oscillating is output via first central beam 904 (and its attached spring structure, not shown) to one input of a differential ac amplifier in amplifier and demodulator portion 432. The current induced by movable fingers 936 and 940 oscillating is output via second central beam 906 (and its attached spring structure, not shown) to the other input of the differential amplifier in amplifier and demodulator section 432.

Isolation couplings 948 and 950 mechanically connect, but electrically isolate, variable capacitance portion 902 from the drive portion (not shown).

When internal feedback is desired, the shunt capacitances are included in each unit 920, 922, 924 and 926. This is illustrated in FIG. 9b. As can be seen, each unit 920, 922, 924, 926 has movable and fixed fingers for internal feedback. The polarity of the feedback signals for each unit match the polarity of that units differential input. Thus, Unit 920 has movable fingers 952 interlaced with fixed fingers 954 for feedback. Fixed fingers 954a receive feedback+, while fixed fingers 954b receive feedback–. Unit 926 has movable fingers 964 interlaced with fixed fingers 966 for feedback. Fixed fingers 966a receive feedback+, while fixed fingers 966b receive feedback–. Unit 922 has movable fingers 956 interlaced with fixed fingers 958 for feedback. Fixed fingers 958a receive feedback–, while fixed fingers 958b receive feedback+. Unit 924 has movable fingers 960 interlaced with fixed fingers 962 for feedback. Fixed fingers 962a receive feedback1, while fixed fingers 954b receive feedback+.

FIG. 9c illustrates an alternative structural connection between central beams. In the structure of FIG. 9c, central beams 904 and 906 are connected by multiple beams arranged in a diamond pattern, in addition to cross beams 908 and 910. Isolation couplings 970, 974 and 972 are now used in addition to isolation couplings 912, 914, 916 and 918 to electrically segregate capacitance portion 902 into the four units. This allows metal jumpers micromachined on top of variable capacitance portion 902 to be used as electrical connections 928 and 930.

ADDITIONAL APPLICATIONS

While the parametric amplifier has been illustrated as a single stage instrumentation amplifier, the parametric amplifier according to the present invention is suitable for a number of applications as previously described. One exemplary additional application of the parametric amplifier is to construct a high frequency amplifier with low offset. Another exemplary additional application is as an electrometer grade operational amplifier.

FIG. 10 illustrates the use of the parametric amplifier to construct a high-frequency amplifier with low-offset. While the parametric amplifier according to the present invention is less susceptible to offset, the use of a mechanical chopper mechanism limits the bandwidth of the parametric amplifier to be on the order of the chopper mechanism's resonant frequency. However, by using a high-frequency amplifier in parallel with the parametric amplifier, an amplifier with decreased offset, but a larger bandwidth than the parametric amplifier is constructed. As illustrated, an amplifier 1002 with higher bandwidth and offset than a parametric amplifier 1000 according to the present invention receives the input voltages $V_{in+}$ and $V_{in-}$. Parametric amplifier 1000 also receives the input voltages to measure the offset of amplifier 1002. Parametric amplifier 1000 provides a low-leakage, low capacitance shunt measurement over temperature and wide common mode ranges. From the measurement, parametric amplifier provides an offset adjustment signal to amplifier 1002 to adjust the offset of amplifier 1002 to under 1 $\mu$V.

Figure 10A:
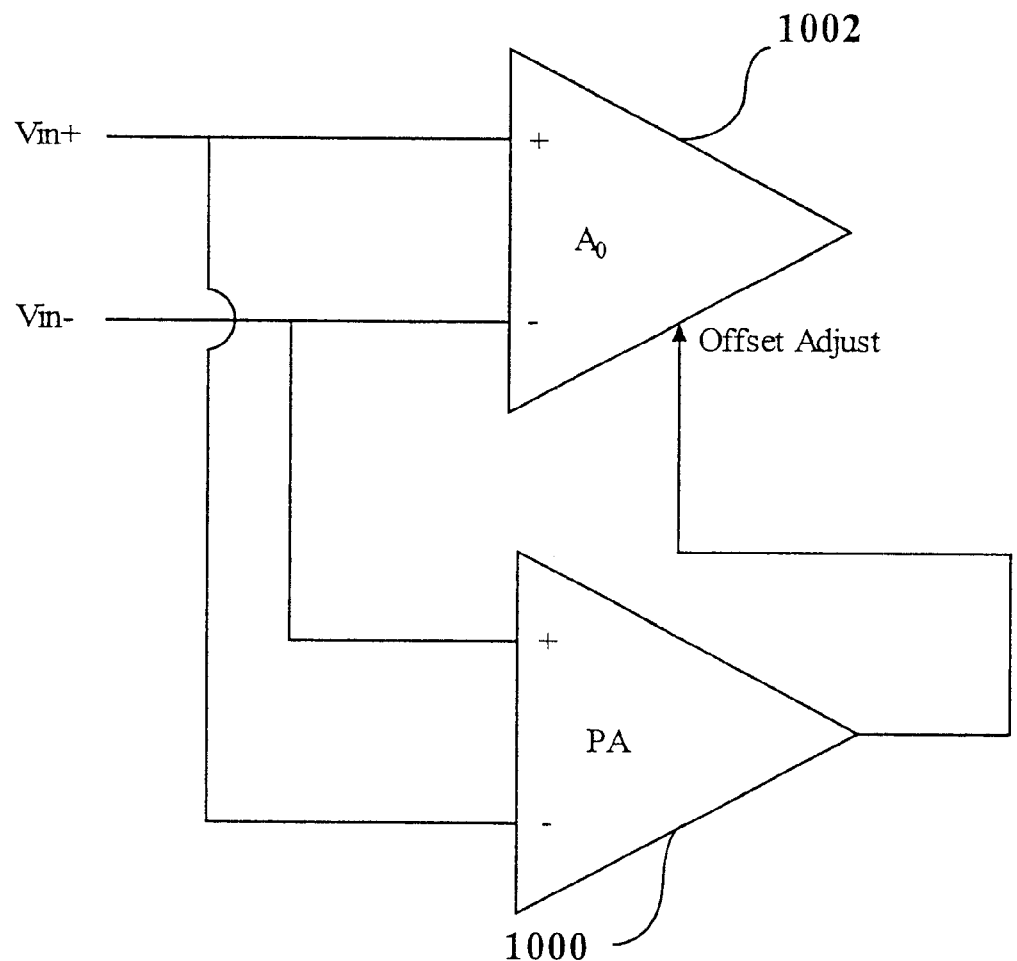
FIG. 10a illustrates a high-frequency amplifier with low-offset constructed using a parametric amplifier according to the present invention to construct.
Figure 10B:
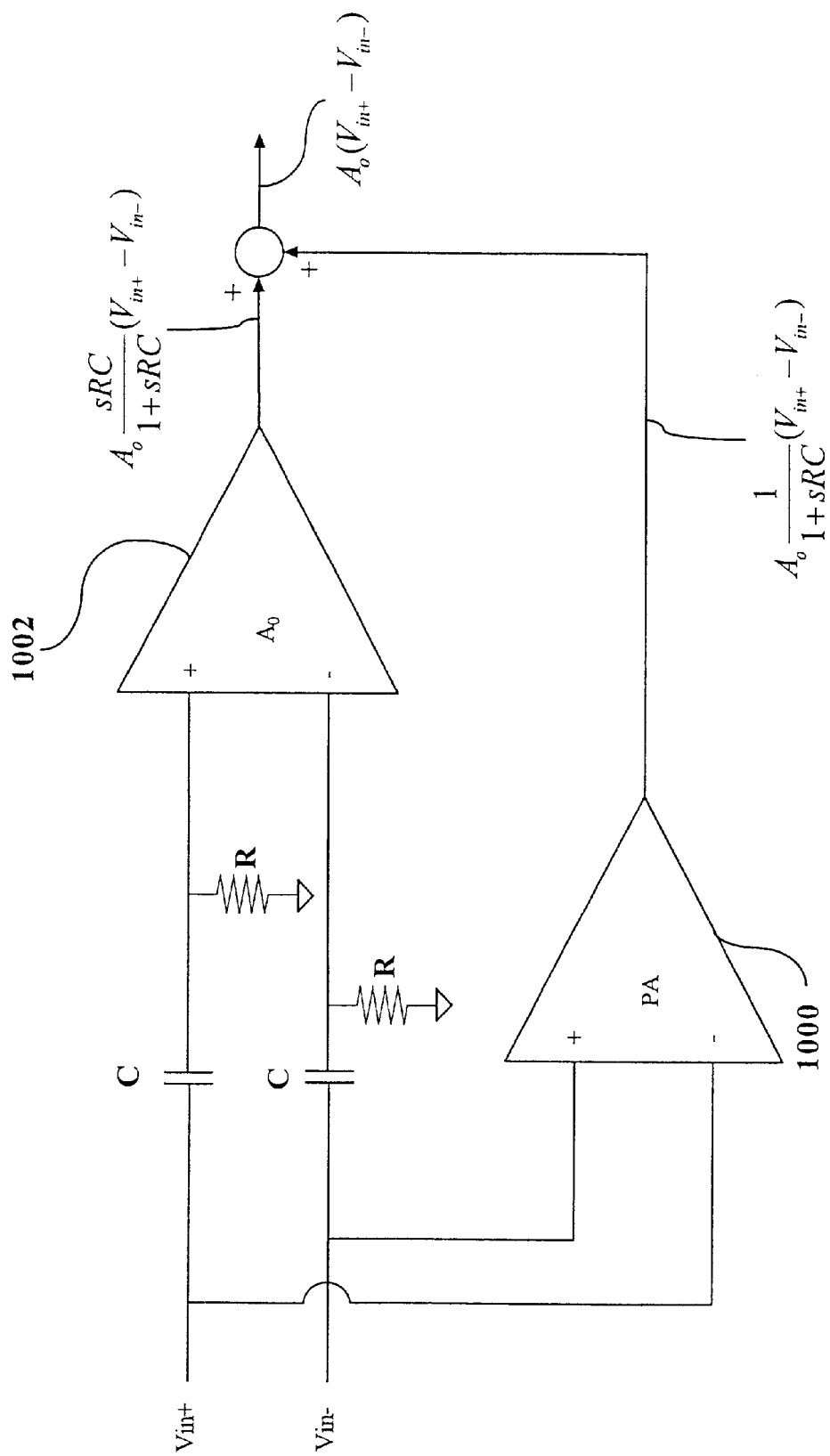
FIG. 10b illustrates a high-bandwidth, galvanically isolated instrumentation amplifier can be constructed using a parametric amplifier according to the present invention

Similar to the high frequency amplifier of FIG. 10a, a high-bandwidth, galvanically isolated instrumentation amplifier can be constructed using a parametric amplifier according to the present invention. This is illustrated in figure 10b. As shown, the differential input voltage is applied to a high-bandwidth amplifier 1002 via an RC filter network. The capacitors of the RC filter network provide for isolation, so that the inputs are able to measure larger voltages. The input voltage is also applied to parametric amplifier 1000, without being applied to the filter network. The output from amplifier 1000 and parametric amplifier 1002 are then superimposed. This construction yields the high-bandwidth, galvanically isolated instrumentation amplifier.

Figure 11A:
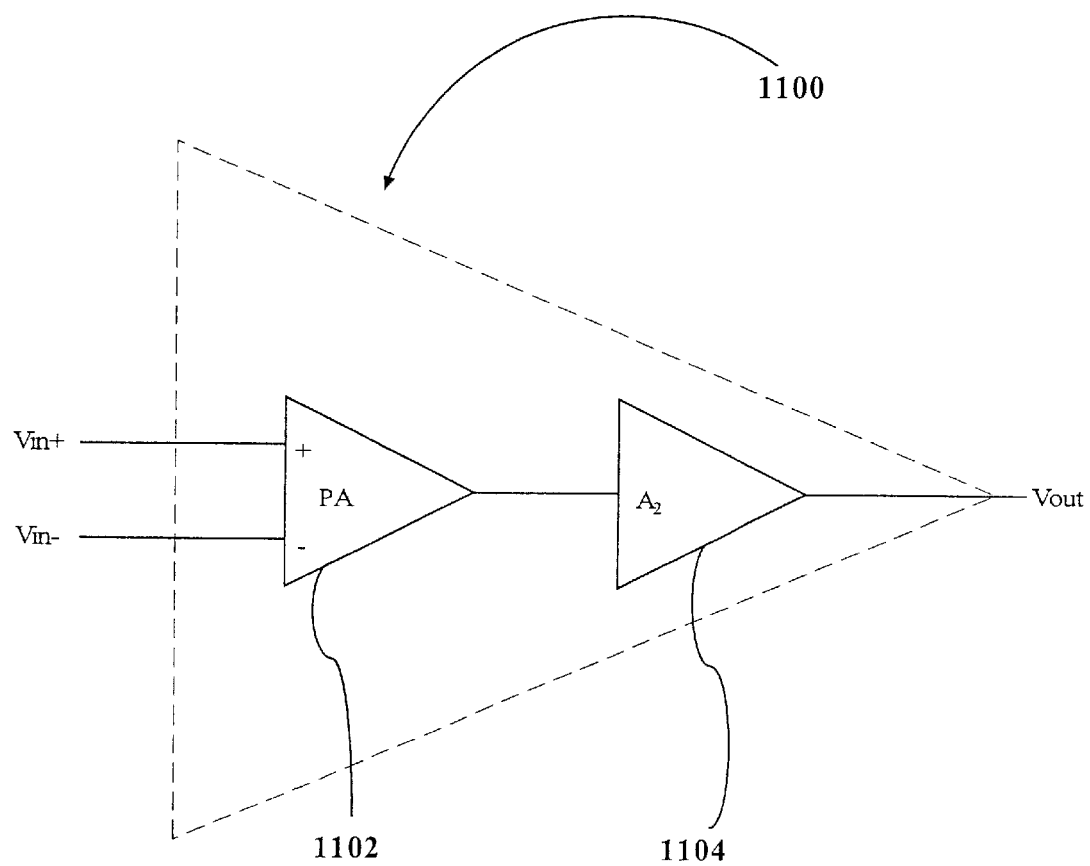
FIG. 11a illustrates the use of a parametric amplifier according to the present invention to implement an operational amplifier with low-noise, low-leakage and wide common mode range.

FIG. 11a illustrates the use of the parametric amplifier to implement an operational amplifier with low-noise, low-leakage and wide common mode range. As illustrated, a parametric amplifier 1102 according to the present invention is used as the first stage of an operational amplifier (op-amp) 1100. A high-gain amplifier 1104 is used as the second stage and is compensated for stability. Parametric amplifier 1102 does not have internal feedback from the self-balanced bridge like an instrumentation amplifier embodiment. Rather, a loop from the output of second stage amplifier 1104 back to $V_{in-}$ would be closed to provide feedback. This creates a self-balanced bridge.

Using parametric amplifier 1102 reduces the needed gain of amplifier 1104 to provide the same overall gain without the parametric amplifier's use. Therefore, because, noise and offset introduced by amplifier 1104 is related to its gain, using parametric amplifier 1102 reduces the second stage amplifier's offset and noise for the same overall gain. For example, if the gain of parametric amplifier 1102 is 10, then the input-referred noise and offset introduced by amplifier 1104 is reduced by a factor of 10.

Figure 11B:
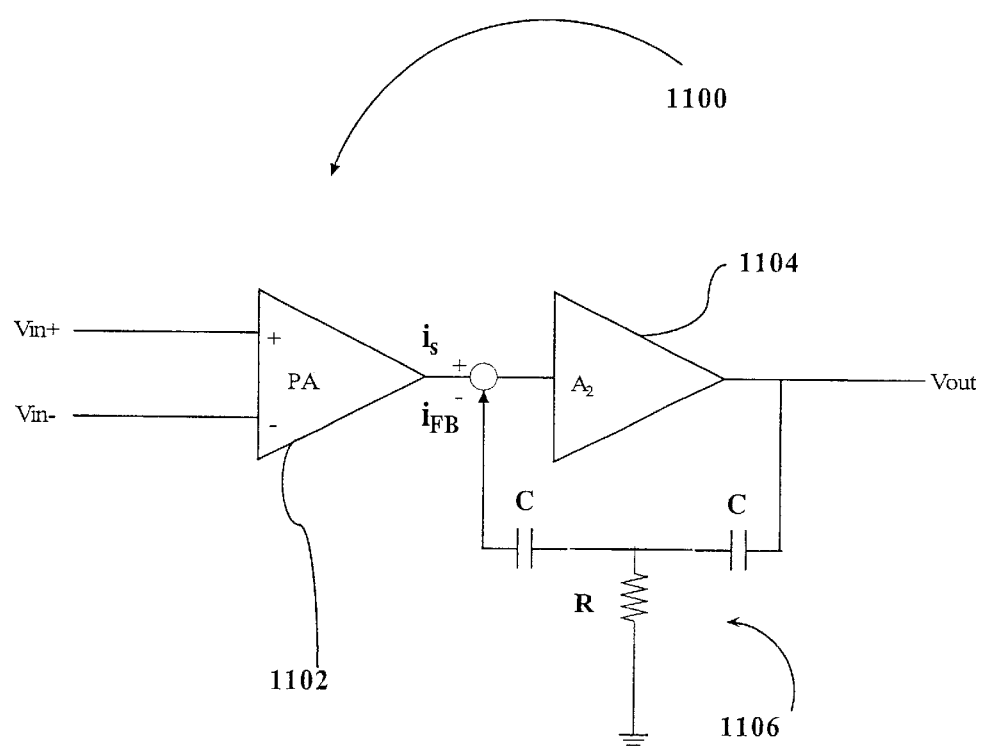
FIG. 11b illustrates a preferred embodiment for compensating the operational amplifier of FIG. 11a for stability.
Figure 11C:
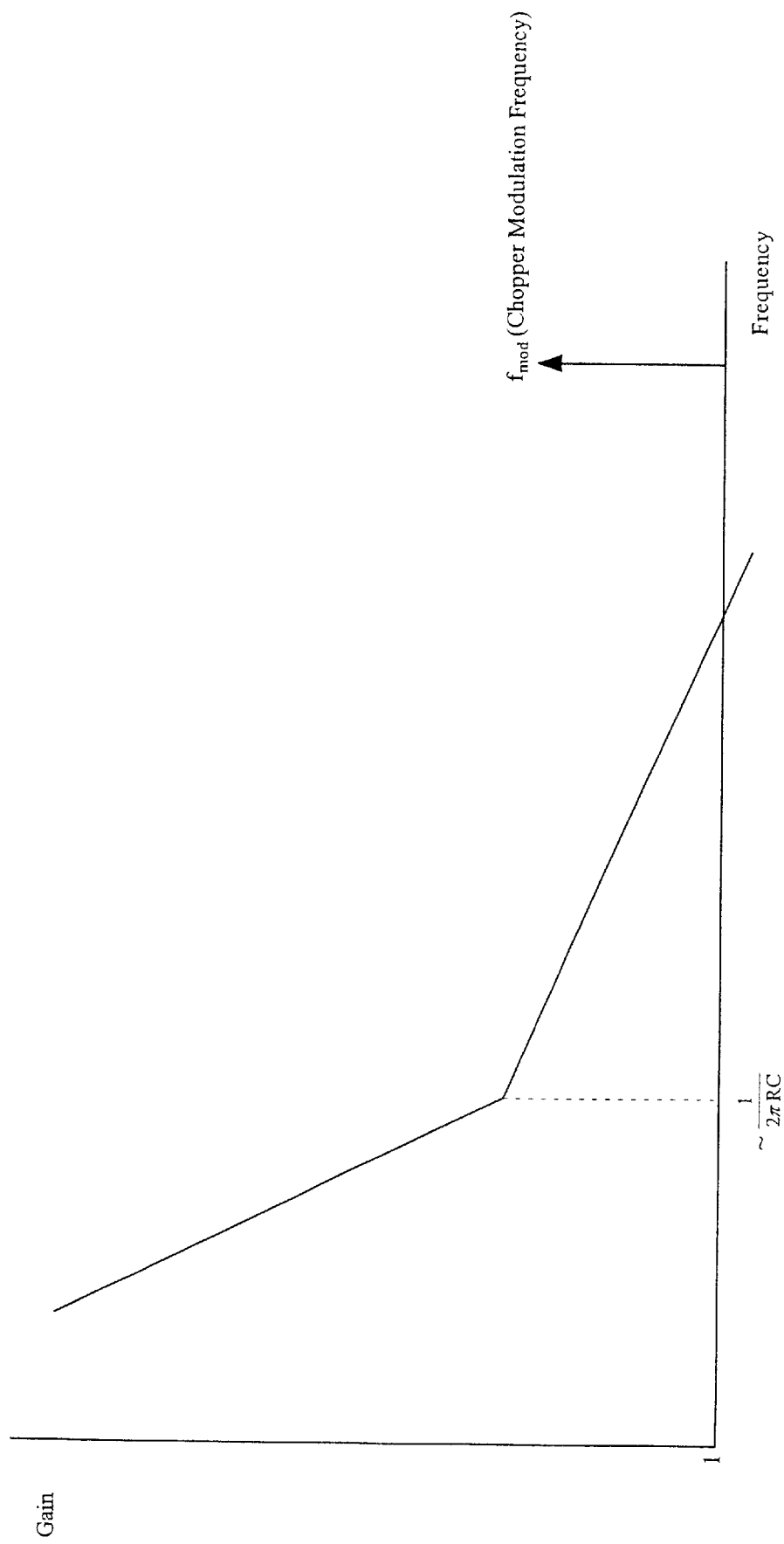
FIG. 11c illustrates the Bode plot of frequency response of the amplifier of FIG. 10a compensating as shown in FIG. 11b.

FIG. 11b illustrates a preferred embodiment for compensating amplifier 1104 for stability. As illustrated, a feedback network 1106 is placed around second stage amplifier 1104. As shown in FIG. 11c, by using feedback network 1106, there is an additional 20 dB/decade gain at frequencies up to approximately $$\frac{1}{4\pi RC},$$

where C is the capacitance and R is the resistance of the capacitors and resistor in feedback network 1106, respectively.

CONCLUSION

Various embodiments of different aspects of the present invention have been illustrated. It will be understood by one of skill in the art that combinations of the various embodiments may be used depending upon the design criteria of the resulting device. Although the present invention has been shown and described with respect to several preferred embodiments thereof, various changes, omissions and additions to the form and detail thereof, may be made therein, without departing from the spirit and scope of the invention.

What is claimed is:

1. A parametric amplifier comprising:
    at least a first variable capacitor structure, the first variable capacitor structure including one or more sections of oscillating capacitive elements comprising cooperating fixed and movable electrodes, the movable electrodes connected to a common center structure;
    an ac amplifier operatively connected to the center structure,
    a demodulator operatively connected to the ac amplifier; and
    wherein the first variable capacitor structure transduces a differential input signal applied with first polarity across the capacitive elements into a modulated input signal, the ac amplifier receives the modulated input signal via the center structure and outputs an amplified modulated input signal, the demodulator receives the amplified modulated input signal and demodulates the amplified modulated input signal to output an amplified input signal.

2. A parametric amplifier, as per claim 1, wherein one or more spring motive forces and one or more electromotive forces place the common center structure in motion to oscillate the movable electrodes of the oscillating capacitive elements.

3. A parametric amplifier, as per claim 2, wherein the one or more sections comprises at least two sections:
    a drive section, the drive section generating the one or more electromotive forces when one or more electrostatic forces are applied to the fixed electrodes of the drive section, and an input sense section, the fixed electrodes of the input sense section having the differential input signal applied thereto with the first polarity.

4. A parametric amplifier, as per claim 3, wherein the input sense section has a cross-quad structure.

5. A parametric amplifier, as per claim 3, wherein
the differential input signal is a differential input voltage, the differential input voltage is transduced into an electric current corresponding to a modulated form of the differential input voltage;
the amplifier receives the electric current via the center structure and outputs an amplified electric current, and
the demodulator receives the amplified electric current and demodulates the amplified electric current to generate a demodulated electric current corresponding to an amplified form of the differential input voltage and generates an output voltage from the demodulated electric current.

6. A parametric amplifier, as per claim 3, wherein the one or more sections comprises at least four sections, additionally including:
a force feedback section, the fixed electrodes of the force feedback section providing a velocity signal to an oscillation control circuit, the velocity signal representative of a velocity of the center structure with respect to the fixed electrodes, the oscillation control circuit generating the one or more electrostatic forces applied to the fixed electrodes of the drive section based upon the velocity signal, and
an input feedback section, the fixed electrodes of the input feedback section operatively connected to an output of the demodulator.

7. A parametric amplifier, as per claim 6, wherein fixed electrodes of the input feedback section are operatively connected to the output of the demodulator via an integrator or other suitable feedback compensation circuit.

8. A parametric amplifier, as per claim 6, wherein the center structure comprises at least one isolation coupling electrically isolating the input sense section and the input feedback section from the drive section and the force feedback section.

9. A parametric amplifier, as per claim 6, wherein the one or more sections comprises a plurality of input sense sections and a ratio of input sense sections to input feedback sections is greater than one.

10. A parametric amplifier, as per claim 6, wherein the one or more sections comprises a plurality of input feedback sections and a ratio of input sense sections to input feedback sections is less than one.

11. A parametric amplifier, as per claim 1, further comprising:
a second micromachined variable capacitor structure, the second variable capacitor structure including one or more sections of capacitive elements comprising cooperating fixed and movable electrodes, the movable electrodes connected to a common center structure, the common center structure of the second variable capacitor structure operatively connected to the ac amplifier.

12. A parametric amplifier, as per claim 11, wherein
one or more spring motive forces and one or more electromotive forces place the common center structure of the first variable capacitor structure and the common center structure of the second variable capacitor structure in motion to create oscillation of the movable electrodes of the first and second variable capacitor structure;
the one or more sections of the first variable capacitor structure comprises at least two sections: a drive section, the drive section generating the one or more electromotive forces when one or more electrostatic forces are applied to the fixed electrodes of the drive section, and an input sense section, the fixed electrodes of the input sense section having the differential input signal applied thereto with the first polarity;
the one or more sections of the second variable capacitor structure comprises at least two sections: a drive section, the drive section generating the one or more electromotive forces when one or more electrostatic forces are applied to the fixed electrodes of the drive section, and an input sense section, the fixed electrodes of the input sense section having the differential input signal applied thereto with second polarity opposite of the first polarity, and
the common center structure of the first variable capacitor structure and the common center structure of the second variable capacitor structure are connected by an isolation coupling such that the common center structure of the first variable capacitor structure and the common center structure of the second variable capacitor structure move substantially in tandem.

13. A parametric amplifier, as per claim 1, further comprising:
a measurement capacitor structure, the measurement capacitor structure including one or more sections of oscillating capacitive elements comprising cooperating fixed and movable electrodes, the movable electrodes connected to a common center structure, the measurement capacitor structure transducing the differential input signal into a common mode correction signal representative of common mode disturbances in the differential input signal, and
wherein a proportion of the common mode correction signal is added to the modulated input signal to remove common mode disturbances from the modulated input signal.

14. A parametric amplifier, as per claim 1, wherein a capacitance of the capacitive elements is mechanically adjusted by isolating one or more of the fixed electrodes from the differential input signal.

15. A parametric amplifier, as per claim 1, wherein the parametric amplifier is used as an operational amplifier.

16. A parametric amplifier, as per claim 1, wherein the parametric amplifier is used to measure offset of a second amplifier and provide an offset correction signal to the second amplifier.

17. A microfabricated parametric amplifier for generating an output voltage by amplifying a differential input voltage, the parametric amplifier comprising:
at least a first micromachined variable capacitor structure having the differential input voltage applied across oscillating capacitive elements of the first capacitor structure to transduce the differential input voltage into a first electric current corresponding to a modulated form of the differential input voltage;
an ac amplifier receiving the first electric current and outputting an amplified electric current;
a demodulator demodulating the amplified electric current to generate a demodulated electric current corresponding to an amplified form of the differential input voltage, and
wherein the output voltage is generated from the demodulated electric current.

18. A microfabricated parametric amplifier for generating an output voltage by amplifying a differential input voltage, as per claim 17, further comprising:
oscillation control circuitry, the oscillation control circuitry controlling a period of oscillation of the capacitive elements.

19. A microfabricated parametric amplifier for generating an output voltage by amplifying a differential input voltage, as per claim 18, wherein the first variable capacitor structure comprises an oscillator portion and an input portion operatively connected by an electrically conductive center structure,
the oscillator portion comprising:
a first spring structure operatively connected to the center structure;
a drive section having first fixed electrically conductive fingers receiving an oscillation control signal from the oscillation control circuit, the first fixed fingers interlaced with first movable electrically conductive fingers, the first movable fingers operatively connected to the center structure; the input portion comprising:
a second spring structure operatively connected to the center structure;
a differential voltage input sense section having second fixed electrically conductive fingers receiving the differential voltage, the second fixed fingers interlaced with second movable electrically conductive fingers, the second movable fingers operatively connected to the center structure.

20. A microfabricated parametric amplifier for generating an output voltage by amplifying a differential input voltage, as per claim 19, wherein the input sense section has a cross-quad structure.

21. A microfabricated parametric amplifier for generating an output voltage by amplifying a differential input voltage, as per claim 19, wherein the first movable fingers and first fixed fingers comprise:
a first set of movable, electrically conductive fingers extending in a first direction substantially parallel to the center structure and operatively connected to the center structure via an electrically conductive cross beam;
a first set of fixed electrically conductive fingers interlaced with the first set of movable fingers;
a second set of movable, electrically conductive fingers extending in a direction substantially opposite to the first direction and operatively connected to the center structure via the electrically conductive cross beam; and
a second set of fixed electrically conductive fingers interlaced with the second set of movable fingers; and
wherein the oscillation control signal comprises a first alternating voltage applied to the first set of fixed fingers and a second alternating voltage applied to the second set of fixed fingers.

22. A microfabricated parametric amplifier for generating an output voltage by amplifying a differential input voltage, as per claim 19, wherein the second movable fingers and second fixed fingers comprise:
a first set of movable, electrically conductive fingers extending in a first direction substantially parallel to the center structure and operatively connected to the center structure via a electrically conductive cross beam;
a first set of fixed electrically conductive fingers interlaced with the first set of movable fingers, the first set of fixed fingers receiving a first electric potential of the differential voltage;
a second set of movable, electrically conductive fingers extending in a direction substantially opposite to the first direction and operatively connected to the center structure via the electrically conductive cross beam; and
a second set of fixed electrically conductive fingers interlaced with the second set of movable fingers, the second set of fixed fingers receiving a second electric potential of the differential voltage.

23. A macrofabricated parametric amplifier for generating an output voltage by amplifying a differential input voltage, as per claim 22, wherein at least one of the first set of fixed fingers is isolated from the first electric potential.

24. A microfabricated parametric amplifier for generating an output voltage by amplifying a differential input voltage, as per claim 19, the oscillator portion further comprising:
a velocity feedback section having third fixed electrically conductive fingers providing a velocity feedback signal to the oscillation control circuit, the velocity feedback signal representative of a velocity of third movable electrically conductive fingers interlaced with the third fixed fingers, the third movable fingers operatively connected to the center structure.

25. A microfabricated parametric amplifier for generating an output voltage by amplifying a differential input voltage, as per claim 24, wherein
the third movable fingers comprise:
a first set of movable, electrically conductive fingers extending in a first direction substantially parallel to the center structure and operatively connected to the center structure via a electrically conductive cross beam;
a second set of movable, electrically conductive fingers extending in a direction substantially opposite to the first direction and operatively connected to the center structure via the electrically conductive cross beam;
the third fixed fingers comprise:
a first set of fixed electrically conductive fingers interlaced with the first set of movable fingers;
a second set of fixed electrically conductive fingers interlaced with the second set of movable fingers, and
wherein the velocity feedback signal comprises a first voltage output by the first fixed fingers and a second voltage output by the second fixed fingers.

26. A microfabricated parametric amplifier for generating an output voltage by amplifying a differential input voltage, as per claim 25, wherein the oscillation control circuit comprises:
a feedback ac amplifier receiving the velocity feedback signal as the first voltage and the second voltage and outputting an amplified velocity feedback signal as an amplified first voltage and an amplified second voltage;
a comparator comparing the amplified first voltage and the second amplified voltage and outputting a first compare signal and a second compare signal based upon the comparison;
a force feedback conditioner conditioning the first compare signal and the second compare signal and outputting the conditioned first compare signal and the conditioned second compare signal as the oscillation control signal.

27. A microfabricated parametric amplifier for generating an output voltage by amplifying a differential input voltage, as per claim 26, the oscillation control circuit further comprising:

a signal limiter receiving the amplified velocity feedback signal and a reference voltage indicative of a maximum magnitude of the oscillation control signal and outputting a limiting signal to the feedback conditioner causing the feedback conditioner to limit a magnitude of the first compare signal and a magnitude of the second compare signal.

28. A microfabricated parametric amplifier for generating an output voltage by amplifying a differential input voltage, as per claim 19, the input portion further comprising:

an input feedback section having third fixed electrically conductive fingers receiving the output voltage, the third fixed fingers interlaced with third movable electrically conductive fingers, the third movable fingers operatively connected to the center structure.

29. A microfabricated parametric amplifier for generating an output voltage by amplifying a differential input voltage, as per claim 28, wherein the output voltage is generated by an integrator or other suitable feedback compensation circuit receiving the demodulated electric current.

30. A microfabricated parametric amplifier for generating an output voltage by amplifying a differential input voltage, as per claim 28, wherein the third movable fingers comprise:
a first set of movable, electrically conductive fingers extending in a first direction substantially parallel to the first center structure and operatively connected to the center structure via a electrically conductive cross beam;
a second set of movable, electrically conductive fingers extending in a direction substantially opposite to the first direction and operatively connected to the center structure via the electrically conductive cross beam;

the third fixed fingers comprise:
a first set of fixed electrically conductive fingers interlaced with the first set of movable fingers, and
a second set of fixed electrically conductive fingers interlaced with the second set of movable fingers.

31. A microfabricated parametric amplifier for generating an output voltage by amplifying a differential input voltage, as per claim 19, wherein the center structure comprises an isolation coupling, the isolation coupling electrically isolating the oscillator portion from the input portion.

32. A microfabricated parametric amplifier for generating an output voltage by amplifying a differential input voltage, as per claim 31, further comprising:

a second micromachined variable capacitor structure having the differential input voltage applied across oscillating capacitive elements of the second capacitor structure to transduce the differential input voltage into a second electric current corresponding to a modulated form of the differential input voltage, the second variable capacitor structure comprising an oscillator portion and an input portion operatively connected by an electrically conductive center structure, the oscillator portion of the second capacitor structure comprising:

a first spring structure operatively connected to the center structure;
a drive section having first fixed electrically conductive fingers receiving an oscillation control signal from the oscillation control circuit, the first fixed fingers interlaced with first movable electrically conductive fingers, the first movable fingers operatively connected to the center structure;

the input portion of the second capacitor structure comprising:
a second spring structure operatively connected to the center structure;
a differential voltage input sense section having second fixed electrically conductive fingers receiving the differential voltage, the second fixed fingers interlaced with second movable electrically conductive fingers, the second movable fingers operatively connected to the center structure, and wherein the center structure of the second capacitor structure comprises an isolation coupling electrically isolating the oscillation portion of the second capacitor structure from the input portion of the second capacitor structure, the first capacitor structure and the second capacitor structure operatively connected via the isolation couplings, the differential voltage is applied across oscillating capacitive elements of the second capacitor structure with opposite polarity than as applied across oscillating capacitive elements of the second capacitor, the ac amplifier is a differential amplifier receiving both the first electric current and the second electric current and outputting an amplified electric current having reduced common mode disturbances.

33. A microfabricated parametric amplifier for generating an output voltage by amplifying a differential input voltage, as per claim 19, further comprising a measurement variable capacitor structure having the differential input voltage applied across oscillating capacitive elements of the second capacitor structure to transduce the differential input voltage into a second electric current representing common mode disturbances in the first electric current, and wherein a proportion of the second electric current is summed with the first electric current to remove the common mode disturbances.

34. A microfabricated parametric amplifier for generating an output voltage by amplifying a differential input voltage, as per claim 17, wherein the parametric amplifier is used as an operational amplifier.

35. A microfabricated parametric amplifier for generating an output voltage by amplifying a differential input voltage, as per claim 17, wherein the parametric amplifier is used to measure offset of a second amplifier and provide an offset correction signal to the second amplifier.

* * * * *